(12) United States Patent
Mitsubori et al.

(10) Patent No.: US 11,557,331 B2
(45) Date of Patent: Jan. 17, 2023

(54) APPARATUSES AND METHODS FOR CONTROLLING REFRESH OPERATIONS

(71) Applicant: MICRON TECHNOLOGY, INC., Boise, ID (US)

(72) Inventors: Shingo Mitsubori, Tokyo (JP); Hidekazu Noguchi, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 155 days.

(21) Appl. No.: 17/030,018

(22) Filed: Sep. 23, 2020

(65) Prior Publication Data

US 2022/0093165 A1    Mar. 24, 2022

(51) Int. Cl.
G11C 11/406    (2006.01)

(52) U.S. Cl.
CPC .............................. G11C 11/40611 (2013.01)

(58) Field of Classification Search
CPC ................................................ G11C 11/40611
USPC ....................................................... 365/222
See application file for complete search history.

(56) References Cited

U.S. PATENT DOCUMENTS

| | | |
|---|---|---|
| 5,299,159 A | 3/1994 | Balistreri et al. |
| 5,654,929 A | 8/1997 | Mote, Jr. |
| 5,699,297 A | 12/1997 | Yamazaki et al. |
| 5,867,442 A | 2/1999 | Kim et al. |
| 5,933,377 A | 8/1999 | Hidaka |
| 5,943,283 A | 8/1999 | Wong et al. |
| 5,956,288 A | 9/1999 | Bermingham et al. |
| 5,959,923 A | 9/1999 | Matteson et al. |
| 5,970,507 A | 10/1999 | Kato et al. |
| 5,999,471 A | 12/1999 | Choi |
| 6,002,629 A | 12/1999 | Kim et al. |
| 6,011,734 A | 1/2000 | Pappert |
| 6,061,290 A | 5/2000 | Shirley |
| 6,064,621 A | 5/2000 | Tanizaki et al. |
| 6,212,118 B1 | 4/2001 | Fujita |
| 6,306,721 B1 | 10/2001 | Teo et al. |
| 6,310,806 B1 | 10/2001 | Higashi et al. |
| 6,310,814 B1 | 10/2001 | Hampel et al. |
| 6,363,024 B1 | 3/2002 | Fibranz |
| 6,392,952 B1 | 5/2002 | Chen et al. |

(Continued)

FOREIGN PATENT DOCUMENTS

| | | |
|---|---|---|
| CN | 101038785 A | 9/2007 |
| CN | 101067972 A | 11/2007 |

(Continued)

OTHER PUBLICATIONS

U.S. Appl. No. 16/432,604 titled "Apparatuses and Methods for Staggered Timing of Skipped Refresh Operations" filed Jun. 5, 2019, pp. all.

(Continued)

Primary Examiner — Anthan Tran
(74) Attorney, Agent, or Firm — Dorsey & Whitney LLP

(57) ABSTRACT

Embodiments of the disclosure are drawn to apparatuses and methods for controlling refresh operations. Responsive to a refresh command, or one or more pumps generated responsive to the refresh command, different banks of a memory array may perform different types of refresh operations for a pump. In some examples, the type of refresh operation performed by a bank may vary from pump to pump of a refresh operation.

14 Claims, 10 Drawing Sheets

(56) References Cited

U.S. PATENT DOCUMENTS

| | | |
|---|---|---|
| 6,424,582 B1 | 7/2002 | Ooishi |
| 6,434,064 B2 | 8/2002 | Nagai |
| 6,452,868 B1 | 9/2002 | Fister |
| 6,515,928 B2 | 2/2003 | Sato et al. |
| 6,535,950 B1 | 3/2003 | Funyu et al. |
| 6,567,340 B1 | 5/2003 | Nataraj et al. |
| 6,950,364 B2 | 9/2005 | Kim |
| 7,002,868 B2 | 2/2006 | Takahashi |
| 7,057,960 B1 | 6/2006 | Fiscus et al. |
| 7,082,070 B2 | 7/2006 | Hong |
| 7,187,607 B2 | 3/2007 | Koshikawa et al. |
| 7,203,113 B2 | 4/2007 | Takahashi et al. |
| 7,203,115 B2 | 4/2007 | Eto et al. |
| 7,209,402 B2 | 4/2007 | Shinozaki et al. |
| 7,215,588 B2 | 5/2007 | Lee |
| 7,444,577 B2 | 10/2008 | Best et al. |
| 7,551,502 B2 | 6/2009 | Dono et al. |
| 7,565,479 B2 | 7/2009 | Best et al. |
| 7,692,993 B2 | 4/2010 | Iida et al. |
| 7,830,742 B2 | 11/2010 | Han |
| 8,174,921 B2 | 5/2012 | Kim et al. |
| 8,400,805 B2 | 3/2013 | Yoko |
| 8,572,423 B1 | 10/2013 | Isachar et al. |
| 8,625,360 B2 | 1/2014 | Iwamoto et al. |
| 8,681,578 B2 | 3/2014 | Narui |
| 8,756,368 B2 | 6/2014 | Best et al. |
| 8,811,100 B2 | 8/2014 | Ku |
| 8,862,973 B2 | 10/2014 | Zimmerman et al. |
| 8,938,573 B2 | 1/2015 | Greenfield et al. |
| 9,032,141 B2 | 5/2015 | Bains et al. |
| 9,047,978 B2 | 6/2015 | Bell et al. |
| 9,076,499 B2 | 7/2015 | Schoenborn et al. |
| 9,087,602 B2 | 7/2015 | Youn et al. |
| 9,117,544 B2 | 8/2015 | Bains et al. |
| 9,123,447 B2 | 9/2015 | Lee et al. |
| 9,153,294 B2 | 10/2015 | Kang |
| 9,190,137 B2 | 11/2015 | Kim et al. |
| 9,190,139 B2 | 11/2015 | Jung et al. |
| 9,236,110 B2 | 1/2016 | Bains et al. |
| 9,251,885 B2 | 2/2016 | Greenfield et al. |
| 9,286,964 B2 | 3/2016 | Halbert et al. |
| 9,299,400 B2 | 3/2016 | Bains et al. |
| 9,311,984 B1 | 4/2016 | Hong et al. |
| 9,311,985 B2 | 4/2016 | Lee et al. |
| 9,324,398 B2 | 4/2016 | Jones et al. |
| 9,384,821 B2 | 7/2016 | Bains et al. |
| 9,390,782 B2 | 7/2016 | Best et al. |
| 9,396,786 B2 | 7/2016 | Yoon et al. |
| 9,406,358 B1 | 8/2016 | Lee |
| 9,412,432 B2 | 8/2016 | Narui et al. |
| 9,418,723 B2 | 8/2016 | Chishti et al. |
| 9,424,907 B2 | 8/2016 | Fujishiro |
| 9,484,079 B2 | 11/2016 | Lee |
| 9,514,850 B2 | 12/2016 | Kim |
| 9,570,143 B2 | 2/2017 | Lim et al. |
| 9,570,201 B2 | 2/2017 | Morgan et al. |
| 9,646,672 B1 | 5/2017 | Kim et al. |
| 9,653,139 B1 | 5/2017 | Park |
| 9,672,889 B2 | 6/2017 | Lee et al. |
| 9,685,240 B1 | 6/2017 | Park |
| 9,691,466 B1 | 6/2017 | Kim |
| 9,697,913 B1 | 7/2017 | Mariani et al. |
| 9,734,887 B1 | 8/2017 | Tavva |
| 9,741,409 B2 | 8/2017 | Jones et al. |
| 9,741,447 B2 | 8/2017 | Akamatsu |
| 9,747,971 B2 | 8/2017 | Bains et al. |
| 9,761,297 B1 | 9/2017 | Tomishima |
| 9,786,351 B2 | 10/2017 | Lee et al. |
| 9,799,391 B1 | 10/2017 | Wei |
| 9,805,782 B1 | 10/2017 | Liou |
| 9,805,783 B2 | 10/2017 | Ito et al. |
| 9,812,185 B2 | 11/2017 | Fisch et al. |
| 9,818,469 B1 | 11/2017 | Kim et al. |
| 9,831,003 B2 | 11/2017 | Sohn et al. |
| 9,865,326 B2 | 1/2018 | Bains et al. |
| 9,865,328 B1 | 1/2018 | Desimone et al. |
| 9,922,694 B2 | 3/2018 | Akamatsu |
| 9,934,143 B2 | 4/2018 | Bains et al. |
| 9,953,696 B2 | 4/2018 | Kim |
| 9,978,430 B2 | 5/2018 | Seo et al. |
| 10,020,045 B2 | 7/2018 | Riho |
| 10,020,046 B1 | 7/2018 | Uemura |
| 10,032,501 B2 | 7/2018 | Ito et al. |
| 10,049,716 B2 | 8/2018 | Proebsting |
| 10,083,737 B2 | 9/2018 | Bains et al. |
| 10,090,038 B2 | 10/2018 | Shin |
| 10,134,461 B2 | 11/2018 | Bell et al. |
| 10,141,042 B1 | 11/2018 | Richter |
| 10,147,472 B2 | 12/2018 | Jones et al. |
| 10,153,031 B2 | 12/2018 | Akamatsu |
| 10,170,174 B1 | 1/2019 | Ito et al. |
| 10,192,608 B2 | 1/2019 | Morgan |
| 10,210,925 B2 | 2/2019 | Bains et al. |
| 10,297,305 B1 | 5/2019 | Moon et al. |
| 10,297,307 B1 | 5/2019 | Raad et al. |
| 10,339,994 B2 | 7/2019 | Ito et al. |
| 10,381,327 B2 | 8/2019 | Ramachandra et al. |
| 10,446,256 B2 | 10/2019 | Ong et al. |
| 10,468,076 B1 | 11/2019 | He et al. |
| 10,490,250 B1 | 11/2019 | Ito et al. |
| 10,490,251 B2 | 11/2019 | Wolff |
| 10,504,577 B1 | 12/2019 | Alzheimer |
| 10,510,396 B1 | 12/2019 | Notani et al. |
| 10,572,377 B1 | 2/2020 | Zhang et al. |
| 10,573,370 B2 | 2/2020 | Ito et al. |
| 10,607,679 B2 | 3/2020 | Nakaoka |
| 10,685,696 B2 | 6/2020 | Brown et al. |
| 10,699,796 B2 | 6/2020 | Benedict et al. |
| 10,790,005 B1 | 9/2020 | He et al. |
| 10,825,505 B2 | 11/2020 | Rehmeyer |
| 10,832,792 B1 | 11/2020 | Penney et al. |
| 10,930,335 B2 | 2/2021 | Bell et al. |
| 10,943,636 B1 | 3/2021 | Wu et al. |
| 10,950,289 B2 | 3/2021 | Ito et al. |
| 10,957,377 B2 | 3/2021 | Noguchi |
| 10,964,378 B2 | 3/2021 | Ayyapureddi et al. |
| 10,978,132 B2 | 4/2021 | Rehmeyer et al. |
| 11,017,833 B2 | 5/2021 | Wu et al. |
| 11,069,393 B2 | 7/2021 | Cowles et al. |
| 11,081,160 B2 | 8/2021 | Ito et al. |
| 11,222,683 B2 | 1/2022 | Rehmeyer |
| 11,222,686 B1 | 1/2022 | Noguchi |
| 11,227,649 B2 | 1/2022 | Meier et al. |
| 11,264,079 B1 | 3/2022 | Roberts |
| 11,302,374 B2 | 4/2022 | Jenkinson et al. |
| 11,302,377 B2 | 4/2022 | Li et al. |
| 11,309,010 B2 | 4/2022 | Ayyapureddi |
| 11,309,012 B2 | 4/2022 | Meier et al. |
| 11,315,619 B2 | 4/2022 | Wolff |
| 11,315,620 B2 | 4/2022 | Ishikawa et al. |
| 11,348,631 B2 | 5/2022 | Wu et al. |
| 2001/0008498 A1 | 7/2001 | Ooishi |
| 2002/0026613 A1 | 2/2002 | Niiro |
| 2002/0181301 A1 | 12/2002 | Takahashi et al. |
| 2002/0191467 A1 | 12/2002 | Matsumoto et al. |
| 2003/0026161 A1 | 2/2003 | Yamaguchi et al. |
| 2003/0063512 A1 | 4/2003 | Takahashi et al. |
| 2003/0067825 A1 | 4/2003 | Shimano et al. |
| 2003/0081483 A1 | 5/2003 | De et al. |
| 2003/0123301 A1 | 7/2003 | Jang et al. |
| 2003/0161208 A1 | 8/2003 | Nakashima et al. |
| 2003/0193829 A1 | 10/2003 | Morgan et al. |
| 2003/0231540 A1 | 12/2003 | Lazar et al. |
| 2004/0004856 A1 | 1/2004 | Sakimura et al. |
| 2004/0008544 A1 | 1/2004 | Shinozaki et al. |
| 2004/0022093 A1 | 2/2004 | Lee |
| 2004/0024955 A1 | 2/2004 | Patel |
| 2004/0114446 A1 | 6/2004 | Takahashi et al. |
| 2004/0130959 A1 | 7/2004 | Kawaguchi |
| 2004/0184323 A1 | 9/2004 | Mori et al. |
| 2004/0218431 A1 | 11/2004 | Chung et al. |
| 2005/0002268 A1 | 1/2005 | Otsuka et al. |
| 2005/0041502 A1 | 2/2005 | Perner |
| 2005/0105362 A1 | 5/2005 | Choi et al. |

(56) References Cited

U.S. PATENT DOCUMENTS

| | | |
|---|---|---|
| 2005/0108460 A1 | 5/2005 | David |
| 2005/0213408 A1 | 9/2005 | Shieh |
| 2005/0243627 A1 | 11/2005 | Lee et al. |
| 2005/0265104 A1 | 12/2005 | Remaklus et al. |
| 2006/0018174 A1 | 1/2006 | Park et al. |
| 2006/0083099 A1 | 4/2006 | Bae et al. |
| 2006/0087903 A1 | 4/2006 | Riho et al. |
| 2006/0104139 A1 | 5/2006 | Hur et al. |
| 2006/0176744 A1 | 8/2006 | Stave |
| 2006/0198220 A1 | 9/2006 | Yoon et al. |
| 2006/0215474 A1 | 9/2006 | Hokenmaier |
| 2006/0233012 A1 | 10/2006 | Sekiguchi et al. |
| 2006/0262616 A1 | 11/2006 | Chen |
| 2006/0262617 A1 | 11/2006 | Lee |
| 2006/0268643 A1 | 11/2006 | Schreck et al. |
| 2007/0002651 A1 | 1/2007 | Lee |
| 2007/0008799 A1 | 1/2007 | Dono et al. |
| 2007/0014175 A1 | 1/2007 | Min et al. |
| 2007/0028068 A1 | 2/2007 | Golding et al. |
| 2007/0030746 A1 | 2/2007 | Best et al. |
| 2007/0033339 A1 | 2/2007 | Best et al. |
| 2007/0147154 A1 | 6/2007 | Lee |
| 2007/0237016 A1 | 10/2007 | Miyamoto et al. |
| 2007/0263442 A1 | 11/2007 | Cornwell et al. |
| 2007/0297252 A1 | 12/2007 | Singh |
| 2008/0028260 A1 | 1/2008 | Oyagi et al. |
| 2008/0031068 A1 | 2/2008 | Yoo et al. |
| 2008/0126893 A1 | 5/2008 | Harrand et al. |
| 2008/0130394 A1 | 6/2008 | Dono et al. |
| 2008/0181048 A1 | 7/2008 | Han |
| 2008/0212386 A1 | 9/2008 | Riho |
| 2008/0224742 A1 | 9/2008 | Pomichter |
| 2008/0253212 A1 | 10/2008 | Iida et al. |
| 2008/0253213 A1 | 10/2008 | Sato et al. |
| 2008/0266990 A1 | 10/2008 | Loeffler |
| 2008/0270683 A1 | 10/2008 | Barth et al. |
| 2008/0306723 A1 | 12/2008 | De Ambroggi et al. |
| 2008/0316845 A1 | 12/2008 | Wang et al. |
| 2009/0021999 A1 | 1/2009 | Tanimura et al. |
| 2009/0052264 A1 | 2/2009 | Hong et al. |
| 2009/0059641 A1 | 3/2009 | Jeddeloh |
| 2009/0073760 A1 | 3/2009 | Betser et al. |
| 2009/0161468 A1 | 6/2009 | Fujioka |
| 2009/0168571 A1 | 7/2009 | Pyo et al. |
| 2009/0185440 A1 | 7/2009 | Lee |
| 2009/0201752 A1 | 8/2009 | Riho et al. |
| 2009/0228739 A1 | 9/2009 | Cohen et al. |
| 2009/0251971 A1 | 10/2009 | Futatsuyama |
| 2009/0296510 A1 | 12/2009 | Lee et al. |
| 2010/0005217 A1 | 1/2010 | Jeddeloh |
| 2010/0005376 A1 | 1/2010 | Laberge et al. |
| 2010/0061153 A1 | 3/2010 | Yen et al. |
| 2010/0074042 A1 | 3/2010 | Fukuda et al. |
| 2010/0097870 A1 | 4/2010 | Kim et al. |
| 2010/0110809 A1 | 5/2010 | Kobayashi et al. |
| 2010/0110810 A1 | 5/2010 | Kobayashi |
| 2010/0124138 A1 | 5/2010 | Lee et al. |
| 2010/0128547 A1 | 5/2010 | Kagami |
| 2010/0131812 A1 | 5/2010 | Mohammad |
| 2010/0141309 A1 | 6/2010 | Lee |
| 2010/0157693 A1 | 6/2010 | Iwai et al. |
| 2010/0182862 A1 | 7/2010 | Teramoto |
| 2010/0182863 A1 | 7/2010 | Fukiage |
| 2010/0329069 A1 | 12/2010 | Ito et al. |
| 2011/0026290 A1 | 2/2011 | Noda et al. |
| 2011/0055495 A1 | 3/2011 | Remaklus et al. |
| 2011/0069572 A1 | 3/2011 | Lee et al. |
| 2011/0122987 A1 | 5/2011 | Neyer |
| 2011/0134715 A1 | 6/2011 | Norman |
| 2011/0216614 A1 | 9/2011 | Hosoe |
| 2011/0225355 A1 | 9/2011 | Kajigaya |
| 2011/0299352 A1 | 12/2011 | Fujishiro et al. |
| 2011/0310648 A1 | 12/2011 | Iwamoto et al. |
| 2012/0014199 A1 | 1/2012 | Narui |
| 2012/0059984 A1 | 3/2012 | Kang et al. |
| 2012/0151131 A1 | 6/2012 | Kilmer et al. |
| 2012/0155173 A1 | 6/2012 | Lee et al. |
| 2012/0155206 A1 | 6/2012 | Kodama et al. |
| 2012/0213021 A1 | 8/2012 | Riho et al. |
| 2012/0254472 A1 | 10/2012 | Ware et al. |
| 2012/0287727 A1 | 11/2012 | Wang |
| 2012/0307582 A1 | 12/2012 | Marumoto et al. |
| 2012/0327734 A1 | 12/2012 | Sato |
| 2013/0003467 A1 | 1/2013 | Klein |
| 2013/0003477 A1 | 1/2013 | Park et al. |
| 2013/0028034 A1 | 1/2013 | Fujisawa |
| 2013/0051157 A1 | 2/2013 | Park |
| 2013/0051171 A1 | 2/2013 | Porter et al. |
| 2013/0077423 A1 | 3/2013 | Lee |
| 2013/0173971 A1 | 7/2013 | Zimmerman |
| 2013/0254475 A1 | 9/2013 | Perego et al. |
| 2013/0279284 A1 | 10/2013 | Jeong |
| 2014/0006700 A1 | 1/2014 | Schaefer et al. |
| 2014/0006703 A1 | 1/2014 | Bains et al. |
| 2014/0006704 A1 | 1/2014 | Greenfield et al. |
| 2014/0013169 A1 | 1/2014 | Kobla et al. |
| 2014/0013185 A1 | 1/2014 | Kobla et al. |
| 2014/0016422 A1 | 1/2014 | Kim et al. |
| 2014/0022858 A1 | 1/2014 | Chen et al. |
| 2014/0043888 A1 | 2/2014 | Chen et al. |
| 2014/0050004 A1 | 2/2014 | Mochida |
| 2014/0078841 A1 | 3/2014 | Chopra |
| 2014/0078842 A1 | 3/2014 | Oh et al. |
| 2014/0089576 A1 | 3/2014 | Bains et al. |
| 2014/0089758 A1 | 3/2014 | Kwok et al. |
| 2014/0095780 A1 | 4/2014 | Bains et al. |
| 2014/0095786 A1 | 4/2014 | Moon et al. |
| 2014/0119091 A1 | 5/2014 | You et al. |
| 2014/0143473 A1 | 5/2014 | Kim et al. |
| 2014/0169114 A1 | 6/2014 | Oh |
| 2014/0177370 A1 | 6/2014 | Halbert et al. |
| 2014/0181453 A1 | 6/2014 | Jayasena et al. |
| 2014/0185403 A1 | 7/2014 | Lai |
| 2014/0189228 A1 | 7/2014 | Greenfield et al. |
| 2014/0219042 A1 | 8/2014 | Yu et al. |
| 2014/0219043 A1 | 8/2014 | Jones et al. |
| 2014/0237307 A1 | 8/2014 | Kobla et al. |
| 2014/0241099 A1 | 8/2014 | Seo et al. |
| 2014/0254298 A1 | 9/2014 | Dally |
| 2014/0281206 A1 | 9/2014 | Crawford et al. |
| 2014/0281207 A1 | 9/2014 | Mandava et al. |
| 2014/0293725 A1 | 10/2014 | Best et al. |
| 2014/0321226 A1 | 10/2014 | Pyeon |
| 2015/0016203 A1 | 1/2015 | Sriramagiri et al. |
| 2015/0036445 A1* | 2/2015 | Yoshida ............ G11C 11/40611 365/222 |
| 2015/0049566 A1 | 2/2015 | Lee et al. |
| 2015/0049567 A1 | 2/2015 | Chi |
| 2015/0055420 A1 | 2/2015 | Bell et al. |
| 2015/0078112 A1 | 3/2015 | Huang |
| 2015/0085564 A1 | 3/2015 | Yoon et al. |
| 2015/0089326 A1 | 3/2015 | Joo et al. |
| 2015/0092508 A1 | 4/2015 | Bains |
| 2015/0109871 A1 | 4/2015 | Bains et al. |
| 2015/0120999 A1 | 4/2015 | Kim et al. |
| 2015/0134897 A1 | 5/2015 | Sriramagiri et al. |
| 2015/0155025 A1* | 6/2015 | Lee .................. G11C 11/40611 365/222 |
| 2015/0162064 A1 | 6/2015 | Oh et al. |
| 2015/0162067 A1 | 6/2015 | Kim et al. |
| 2015/0170728 A1 | 6/2015 | Jung et al. |
| 2015/0199126 A1 | 7/2015 | Jayasena et al. |
| 2015/0206572 A1 | 7/2015 | Lim et al. |
| 2015/0213872 A1 | 7/2015 | Mazumder et al. |
| 2015/0243339 A1 | 8/2015 | Bell et al. |
| 2015/0255140 A1 | 9/2015 | Song |
| 2015/0279442 A1 | 10/2015 | Hwang |
| 2015/0294711 A1 | 10/2015 | Gaither et al. |
| 2015/0340077 A1 | 11/2015 | Akamatsu |
| 2015/0356048 A1 | 12/2015 | King |
| 2015/0380073 A1 | 12/2015 | Joo et al. |
| 2016/0019940 A1 | 1/2016 | Jang et al. |
| 2016/0027498 A1 | 1/2016 | Ware et al. |
| 2016/0027531 A1 | 1/2016 | Jones et al. |

(56) References Cited

U.S. PATENT DOCUMENTS

| | | |
|---|---|---|
| 2016/0027532 A1 | 1/2016 | Kim |
| 2016/0042782 A1 | 2/2016 | Narui et al. |
| 2016/0070483 A1 | 3/2016 | Yoon et al. |
| 2016/0078846 A1 | 3/2016 | Liu et al. |
| 2016/0078911 A1 | 3/2016 | Fujiwara et al. |
| 2016/0086649 A1 | 3/2016 | Hong et al. |
| 2016/0093402 A1 | 3/2016 | Kitagawa et al. |
| 2016/0125931 A1 | 5/2016 | Doo et al. |
| 2016/0133314 A1 | 5/2016 | Hwang et al. |
| 2016/0155491 A1 | 6/2016 | Roberts et al. |
| 2016/0180917 A1 | 6/2016 | Chishti et al. |
| 2016/0180921 A1 | 6/2016 | Jeong |
| 2016/0196863 A1 | 7/2016 | Shin et al. |
| 2016/0202926 A1 | 7/2016 | Benedict |
| 2016/0225433 A1 | 8/2016 | Bains et al. |
| 2016/0336060 A1 | 11/2016 | Shin |
| 2016/0343423 A1 | 11/2016 | Shido |
| 2017/0011792 A1 | 1/2017 | Oh et al. |
| 2017/0052722 A1 | 2/2017 | Ware et al. |
| 2017/0076779 A1 | 3/2017 | Bains et al. |
| 2017/0092350 A1 | 3/2017 | Halbert et al. |
| 2017/0111792 A1 | 4/2017 | Correia Fernandes et al. |
| 2017/0133085 A1 | 5/2017 | Kim et al. |
| 2017/0133108 A1 | 5/2017 | Lee et al. |
| 2017/0140807 A1 | 5/2017 | Sun et al. |
| 2017/0140810 A1 | 5/2017 | Choi et al. |
| 2017/0140811 A1 | 5/2017 | Joo |
| 2017/0146598 A1 | 5/2017 | Kim et al. |
| 2017/0148504 A1 | 5/2017 | Saifuddin et al. |
| 2017/0177246 A1 | 6/2017 | Miller et al. |
| 2017/0186481 A1 | 6/2017 | Oh et al. |
| 2017/0213586 A1 | 7/2017 | Kang et al. |
| 2017/0221546 A1 | 8/2017 | Loh et al. |
| 2017/0263305 A1 | 9/2017 | Cho |
| 2017/0269861 A1 | 9/2017 | Lu et al. |
| 2017/0287547 A1 | 10/2017 | Ito et al. |
| 2017/0323675 A1 | 11/2017 | Jones et al. |
| 2017/0345482 A1 | 11/2017 | Balakrishnan |
| 2017/0352404 A1 | 12/2017 | Lee et al. |
| 2018/0005690 A1 | 1/2018 | Morgan et al. |
| 2018/0025770 A1 | 1/2018 | Ito et al. |
| 2018/0025772 A1 | 1/2018 | Lee et al. |
| 2018/0025773 A1 | 1/2018 | Bains et al. |
| 2018/0033479 A1 | 2/2018 | Lea et al. |
| 2018/0047110 A1 | 2/2018 | Blackman et al. |
| 2018/0061476 A1 | 3/2018 | Kim |
| 2018/0061483 A1 | 3/2018 | Morgan |
| 2018/0061485 A1 | 3/2018 | Joo |
| 2018/0075927 A1 | 3/2018 | Jeong et al. |
| 2018/0082737 A1 | 3/2018 | Lee |
| 2018/0096719 A1 | 4/2018 | Tomishima et al. |
| 2018/0102776 A1 | 4/2018 | Chandrasekar et al. |
| 2018/0107417 A1 | 4/2018 | Shechter et al. |
| 2018/0108401 A1 | 4/2018 | Choi et al. |
| 2018/0114561 A1 | 4/2018 | Fisch et al. |
| 2018/0114565 A1 | 4/2018 | Lee |
| 2018/0122454 A1 | 5/2018 | Lee et al. |
| 2018/0130506 A1 | 5/2018 | Kang et al. |
| 2018/0137095 A1 | 5/2018 | Wu et al. |
| 2018/0158504 A1 | 6/2018 | Akamatsu |
| 2018/0158507 A1 | 6/2018 | Bang |
| 2018/0182445 A1 | 6/2018 | Lee et al. |
| 2018/0190340 A1 | 7/2018 | Kim et al. |
| 2018/0218767 A1 | 8/2018 | Wolff |
| 2018/0226119 A1 | 8/2018 | Kim et al. |
| 2018/0233197 A1 | 8/2018 | Laurent |
| 2018/0240511 A1 | 8/2018 | Yoshida et al. |
| 2018/0247876 A1 | 8/2018 | Kim et al. |
| 2018/0254078 A1 | 9/2018 | We et al. |
| 2018/0261268 A1 | 9/2018 | Hyun et al. |
| 2018/0276150 A1 | 9/2018 | Eckert et al. |
| 2018/0285007 A1 | 10/2018 | Franklin et al. |
| 2018/0294028 A1 | 10/2018 | Lee et al. |
| 2018/0308539 A1 | 10/2018 | Ito et al. |
| 2018/0341553 A1 | 11/2018 | Koudele et al. |
| 2019/0013059 A1 | 1/2019 | Akamatsu |
| 2019/0043558 A1 | 2/2019 | Suh et al. |
| 2019/0051344 A1 | 2/2019 | Bell et al. |
| 2019/0065087 A1 | 2/2019 | Li et al. |
| 2019/0066759 A1 | 2/2019 | Nale |
| 2019/0066766 A1 | 2/2019 | Lee |
| 2019/0088315 A1 | 3/2019 | Saenz et al. |
| 2019/0088316 A1 | 3/2019 | Inuzuka et al. |
| 2019/0103147 A1 | 4/2019 | Jones et al. |
| 2019/0115069 A1 | 4/2019 | Lai |
| 2019/0122723 A1 | 4/2019 | Ito et al. |
| 2019/0129651 A1 | 5/2019 | Wuu et al. |
| 2019/0130960 A1 | 5/2019 | Kim |
| 2019/0130961 A1 | 5/2019 | Bell et al. |
| 2019/0147964 A1 | 5/2019 | Yun et al. |
| 2019/0161341 A1 | 5/2019 | Howe |
| 2019/0190341 A1 | 6/2019 | Beisele et al. |
| 2019/0196730 A1 | 6/2019 | Imran |
| 2019/0198078 A1 | 6/2019 | Hoang et al. |
| 2019/0198099 A1 | 6/2019 | Mirichigni et al. |
| 2019/0205253 A1 | 7/2019 | Roberts |
| 2019/0228810 A1 | 7/2019 | Jones et al. |
| 2019/0228815 A1 | 7/2019 | Morohashi et al. |
| 2019/0252020 A1 | 8/2019 | Rios et al. |
| 2019/0267077 A1 | 8/2019 | Ito et al. |
| 2019/0279706 A1 | 9/2019 | Kim |
| 2019/0294348 A1 | 9/2019 | Ware et al. |
| 2019/0333573 A1 | 10/2019 | Shin et al. |
| 2019/0347019 A1* | 11/2019 | Shin ............ G06F 3/0629 |
| 2019/0348100 A1 | 11/2019 | Smith et al. |
| 2019/0348102 A1 | 11/2019 | Smith et al. |
| 2019/0348103 A1 | 11/2019 | Jeong et al. |
| 2019/0362774 A1 | 11/2019 | Kuramori et al. |
| 2019/0385661 A1 | 12/2019 | Koo et al. |
| 2019/0385667 A1 | 12/2019 | Morohashi et al. |
| 2019/0385668 A1 | 12/2019 | Fujioka et al. |
| 2019/0385670 A1 | 12/2019 | Notani et al. |
| 2019/0386557 A1 | 12/2019 | Wang et al. |
| 2019/0391760 A1 | 12/2019 | Miura et al. |
| 2019/0392886 A1 | 12/2019 | Cox et al. |
| 2020/0005857 A1 | 1/2020 | Ito et al. |
| 2020/0051616 A1 | 2/2020 | Cho |
| 2020/0075086 A1 | 3/2020 | Hou et al. |
| 2020/0082873 A1 | 3/2020 | Wolff |
| 2020/0126611 A1 | 4/2020 | Riho et al. |
| 2020/0135263 A1 | 4/2020 | Brown et al. |
| 2020/0143871 A1 | 5/2020 | Kim et al. |
| 2020/0176050 A1 | 6/2020 | Ito et al. |
| 2020/0185026 A1 | 6/2020 | Yun et al. |
| 2020/0194056 A1 | 6/2020 | Sakurai et al. |
| 2020/0202921 A1 | 6/2020 | Morohashi et al. |
| 2020/0210278 A1 | 7/2020 | Rooney et al. |
| 2020/0211632 A1 | 7/2020 | Noguchi |
| 2020/0211633 A1 | 7/2020 | Okuma |
| 2020/0211634 A1 | 7/2020 | Ishikawa et al. |
| 2020/0219555 A1 | 7/2020 | Rehmeyer |
| 2020/0219556 A1 | 7/2020 | Ishikawa et al. |
| 2020/0265888 A1 | 8/2020 | Ito et al. |
| 2020/0273517 A1 | 8/2020 | Yamamoto |
| 2020/0273518 A1 | 8/2020 | Raad et al. |
| 2020/0279599 A1 | 9/2020 | Ware et al. |
| 2020/0294569 A1 | 9/2020 | Wu et al. |
| 2020/0294576 A1 | 9/2020 | Brown et al. |
| 2020/0321049 A1 | 10/2020 | Meier et al. |
| 2020/0381040 A1 | 12/2020 | Penney et al. |
| 2020/0388324 A1 | 12/2020 | Rehmeyer et al. |
| 2020/0388325 A1 | 12/2020 | Cowles et al. |
| 2020/0395063 A1 | 12/2020 | Rehmeyer |
| 2021/0057021 A1 | 2/2021 | Wu et al. |
| 2021/0057022 A1 | 2/2021 | Jenkinson et al. |
| 2021/0118491 A1 | 4/2021 | Li et al. |
| 2021/0166752 A1 | 6/2021 | Noguchi |
| 2021/0183433 A1 | 6/2021 | Jenkinson et al. |
| 2021/0183435 A1 | 6/2021 | Meier et al. |
| 2021/0225431 A1 | 7/2021 | Rehmeyer et al. |
| 2021/0304813 A1 | 9/2021 | Cowles et al. |
| 2021/0335411 A1 | 10/2021 | Wu et al. |
| 2022/0059153 A1 | 2/2022 | Zhang et al. |
| 2022/0059158 A1 | 2/2022 | Wu et al. |

(56) References Cited

U.S. PATENT DOCUMENTS

| | | | |
|---|---|---|---|
| 2022/0165328 | A1 | 5/2022 | Ishikawa et al. |
| 2022/0189539 | A1 | 6/2022 | Li et al. |
| 2022/0199144 | A1 | 6/2022 | Roberts |

FOREIGN PATENT DOCUMENTS

| | | | |
|---|---|---|---|
| CN | 104350546 | A | 2/2015 |
| CN | 106710621 | A | 5/2017 |
| CN | 107871516 | A | 4/2018 |
| JP | 2005-216429 | A | 8/2005 |
| JP | 2011-258259 | | 12/2011 |
| JP | 2011-258259 | A | 12/2011 |
| JP | 4911510 | B2 | 1/2012 |
| JP | 2013-004158 | A | 1/2013 |
| JP | 6281030 | B1 | 1/2018 |
| WO | 2014120477 | | 8/2014 |
| WO | 2015030991 | A1 | 3/2015 |
| WO | 2017171927 | A1 | 10/2017 |
| WO | 2019222960 | A1 | 11/2019 |
| WO | 2020010010 | A1 | 1/2020 |
| WO | 2020117686 | A1 | 6/2020 |
| WO | 2020247163 | A1 | 12/2020 |
| WO | 2020247639 | A1 | 12/2020 |

OTHER PUBLICATIONS

U.S. Appl. No. 17/226,975, titled "Apparatuses and Methods for Staggered Timing of Skipped Refresh Operations" filed Apr. 9, 2021, pp. all.
U.S. Appl. No. 17/654,035, titled "Apparatuses and Methods for Dynamic Targeted Refresh Steals", filed Mar. 8, 2022; pp. all pages of application as filed.
U.S. Appl. No. 17/662,733, titled "Apparatuses, Systems, and Methods for Identifying Victim Rows in a Memory Device Which Cannot Be Simultaneously Refreshed" filed May 10, 2022, pp. all pages of application as filed.
U.S. Appl. No. 17/324,621 titled "Apparatuses And Methods for Pure-Time, Self-Adopt Sampling For Row Hammer Refresh Sampling" filed May 19, 2021.
U.S. Appl. No. 17/347,957 titled "Apparatuses and Methods for Controlling Steal Rates" filed Jun. 15, 2021.
U.S. Appl. No. 17/175,485 titled "Apparatuses and Methods for Distributed Targeted Refresh Operations" filed Feb. 12, 2021, pp. all.
U.S. Appl. No. 17/186,913 titled "Apparatuses and Methods for Dynamic Refresh Allocation" filed Feb. 26, 2021, pp. all.
U.S. Appl. No. 17/187,002 titled "Apparatuses and Methods for Staggered Timing of Targeted Refresh Operations" filed Feb. 26, 2021, pp. all.
U.S. Appl. No. 16/994,338, titled "Apparatuses, Systems, and Methods for Memory Directed Access Pause" filed Aug. 14, 2020, pp. all.
U.S. Appl. No. 16/997,659 titled "Apparatuses, Systems, and Methods for Refresh Modes" filed Aug. 19, 2020; pp. all.
U.S. Appl. No. 17/127,654 titled "Apparatuses and Methods for Row Hammer Based Cache Lockdown" filed Dec. 18, 2020, pp. all.
U.S. Appl. No. 16/546,152 titled "Apparatuses and Methods for Analog Row Access Tracking" filed Aug. 20, 2019, pp. all.
U.S. Appl. No. 16/548,027 titled "Apparatuses, Systems, and Methods for Analog Row Access Rate Determination" filed Aug. 22, 2019, pp. all.
U.S. Appl. No. 16/549,942 titled "Apparatuses and Methods for Lossy Row Access Counting" filed Aug. 23, 2019, pp. all.
U.S. Appl. No. 16/788,657, titled "Semiconductor Device Performing Row Hammer Refresh Operation", dated Feb. 12, 2020, pp. all.
U.S. Appl. No. 15/881,256 entitled 'Apparatuses and Methods for Detecting a Row Hammer Attack With a Bandpass Filter' filed Jan. 26, 2018, pp. all.
U.S. Appl. No. 16/425,525 titled "Apparatuses and Methods For Tracking All Row Accesses" filed May 29, 2019, pp. all.

U.S. Appl. No. 16/427,105 titled "Apparatuses and Methods for Priority Targeted Refresh Operations" filed May 30, 2019, pp. all.
U.S. Appl. No. 16/427,140 titled "Apparatuses and Methods for Tracking Row Access Counts Between Multiple Register Stacks" filed May 30, 2019, pp. all.
U.S. Appl. No. 16/437,811 titled "Apparatuses, Systems, and Methods for Determining Extremum Numerical Values" filed Jun. 11, 2019, pp. all.
U.S. Appl. No. 16/513,400 titled "Apparatuses and Methods for Tracking Row Accesses" filed Jul. 16, 2019, pp. all.
U.S. Appl. No. 16/537,981 titled "Apparatuses and Methods for Controlling Targeted Refresh Rates" filed Aug. 12, 2019, pp. all.
U.S. Appl. No. 16/655,110 titled "Apparatuses and Methods for Dynamic Targeted Refresh Steals" filed Oct. 16, 2019, pp. all.
U.S. Appl. No. 17/008,396 titled "Apparatuses and Methods for Staggered Timing of Targeted Refresh Operations" filed Aug. 31. 2020, pp. all.
U.S. Appl. No. 15/789,897, entitled "Apparatus and Methods for Refreshing Memory", filed Oct. 20, 2017; pp. all.
U.S. Appl. No. 15/796,340, entitled: "Apparatus and Methods for Refreshing Memory" filed Oct. 27, 2017; pp. all.
U.S. Appl. No. 16/012,679, titled "Apparatuses and Methods for Multiple Row Hammer Refresh Address Sequences", filed Jun. 19, 2018, pp. all.
U.S. Appl. No. 16/020,863, titled "Semiconductor Device", filed Jun. 27, 2018, pp. all.
U.S. Appl. No. 16/112,471 titled "Apparatuses and Methods for Controlling Refresh Operations" filed Aug. 24, 2018, pp. all.
U.S. Appl. No. 16/160,801, titled "Apparatuses and Methods for Selective Row Refreshes" filed Oct. 15, 2018, pp all.
U.S. Appl. No. 16/176,932, titled "Apparatuses and Methods for Access Based Refresh Timing", filed Oct. 31, 2018, pp. all.
U.S. Appl. No. 16/208,217, titled "Semiconductor Device Performing Row Hammer Refresh Operation", filed Dec. 3, 2018, pp. all.
U.S. Appl. No. 16/230,300, titled "Apparatuses and Methods for Staggered Timing of Targeted Refresh Operations" filed Dec. 21, 2018, pp. all.
U.S. Appl. No. 16/231,327 titled "Apparatuses and Methods for Selective Row Refreshes", filed Dec. 21, 2018, pp. all.
U.S. Appl. No. 16/237,291, titled "Apparatus and Methods for Refreshing Memory", filed Dec. 31, 2018, pp. all.
U.S. Appl. No. 16/290,730, titled "Semiconductor Device Performing Row Hammer Refresh Operation", filed Mar. 1, 2019, pp. all.
U.S. Appl. No. 16/374.623, titled "Semiconductor Device Performing Row Hammer Refresh Operation", filed Apr. 3, 2019, pp. all.
U.S. Appl. No. 16/411,573 titled "Apparatuses, Systems, and Methods for a Content Addressable Memory Cell" filed May 14, 2019, pp. all.
U.S. Appl. No. 16/411,698 title "Semiconductor Device" filed May 14, 2019, pp. all.
U.S. Appl. No. 16/427,330 titled "Apparatuses and Methods for Storing Victim Row Data" filed May 30, 2019, pp. all.
U.S. Appl. No. 16/428,625 titled "Apparatuses and Methods for Tracking Victim Rows" filed May 31, 2019, pp. all.
U.S. Appl. No. 16/431,641 titled "Apparatuses and Methods for Controlling Steal Rates" filed Jun. 4, 2019, pp. all.
U.S. Appl. No. 16/549,411 titled "Apparatuses and Methods for Dynamic Refresh Allocation" filed Aug. 23, 2019, pp. all.
U.S. Appl. No. 16/682,606, titled "Apparatuses and Methods for Distributing Row Hammer Refresh Events Across a Memory Device", filed Nov. 13, 2019, pp. all.
U.S. Appl. No. 15/876,566 entitled 'Apparatuses and Methods for Calculating Row Hammer Refresh Addresses in a Semiconductor Device' filed Jan. 22, 2018, pp. all.
U.S. Appl. No. 15/656,084, titled: Apparatuses and Methods for Targeted Refreshing of Memory, filed: Jul. 21, 2017, pp. all.
U.S. Appl. No. 15/715,846, entitled "Semiconductor Device", filed Sep. 26, 2017, pp. all.
U.S. Appl. No. 15/888,993, entitled "Apparatuses and Methods for Controlling Refresh Operations", filed Feb. 5, 2018, pp. all.
U.S. Appl. No. 16/190.627 titled "Apparatuses and Methods for Targeted Refreshing of Memory" filed Nov. 14, 2018, pp. all.

(56) References Cited

OTHER PUBLICATIONS

U.S. Appl. No. 16/459,520 titled "Apparatuses and Methods for Monitoring Word Line Accesses", filed Jul. 1, 2019, pp. all.
U.S. Appl. No. 15/281,818, entitled: "Semiconductor Device" filed Sep. 30, 2016, pp. all.
Kim, et al., "Flipping Bits in MemoryWithout Accessing Them: An Experimental Study of DRAM Disturbance Errors", IEEE, Jun. 2014, 12 pgs.
U.S. Appl. No. 16/997,766 titled "Refresh Logic Circuit Layouts Thereof" filed Aug. 19, 2020, pp. all.
U.S. Appl. No. 17/095,978 titled "Apparatuses and Methods for Controlling Refresh Timing" filed Nov. 12, 2020, pp. all.
U.S. Appl. No. 17/731,529, titled "Apparatuses and Methods for Access Based Refresh Operations"; filed Apr. 28, 2022; pp. all pages of the application as filed.
U.S. Appl. No. 17/731,645, titled "Apparatuses and Methods for Access Based Targeted Refresh Operations", filed Apr. 28, 2022; pp. all pages of application as filed.

\* cited by examiner

APPARATUSES AND METHODS FOR CONTROLLING REFRESH OPERATIONS

BACKGROUND

Information may be stored on individual memory cells of the memory as a physical signal (e.g., a charge on a capacitive element). The memory may be a volatile memory, and the physical signal may decay over time (which may degrade or destroy the information stored in the memory cells). It may be necessary to periodically refresh the information in the memory cells by, for example, rewriting the information to restore the physical signal to an initial value.

As memory components have decreased in size, the density of memory cells has greatly increased. An auto refresh operation may be carried out where a sequence of memory cells are periodically refreshed. Repeated access to a particular memory cell or group of memory cells (often referred to as a 'row hammer') may cause an increased rate of data degradation in nearby memory cells. It may be desirable to identify and refresh memory cells affected by the row hammer in a targeted refresh operation in addition to the auto refresh operation. The targeted refresh operations may occur with timing interspersed between the auto refresh operations.

DETAILED DESCRIPTION

Figure 1A:
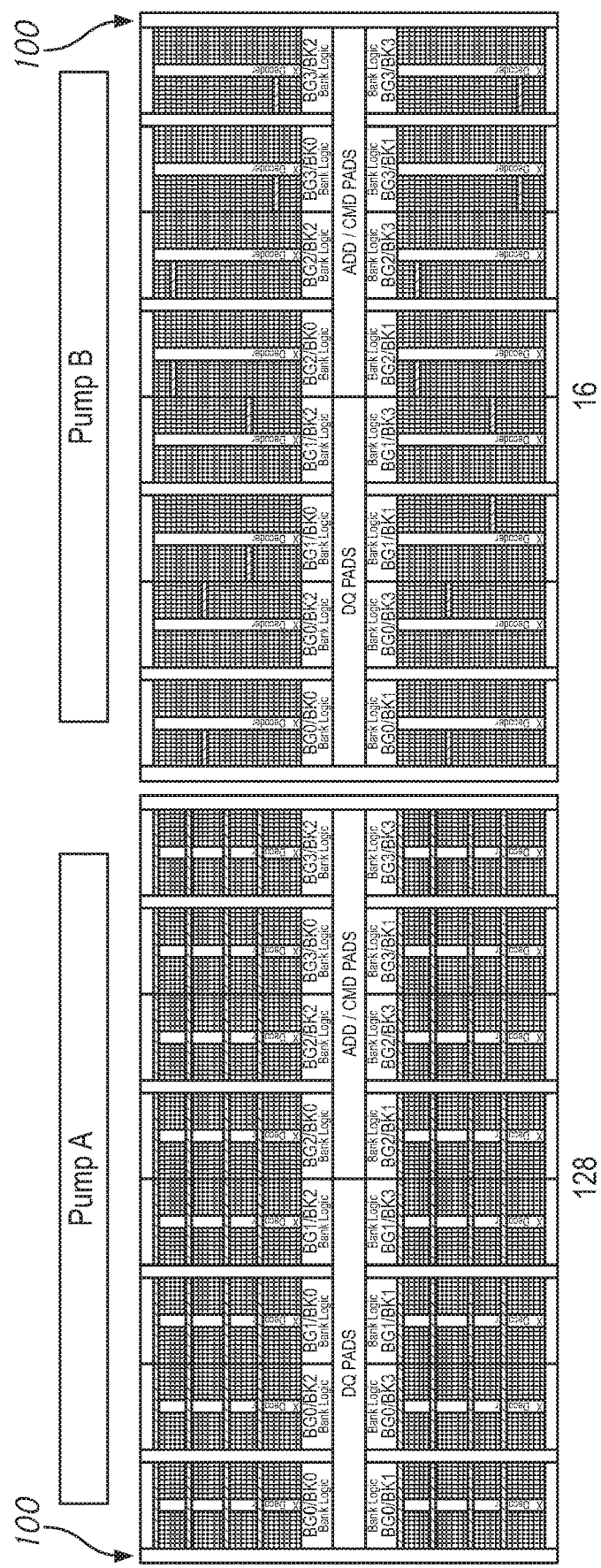
FIG. 1A illustrates an example of two different refresh operations in a memory device.

The following description of certain embodiments is merely exemplary in nature and is in no way intended to limit the scope of the disclosure or its applications or uses. In the following detailed description of embodiments of the present systems and methods, reference is made to the accompanying drawings which form a part hereof, and which are shown by way of illustration specific embodiments in which the described systems and methods may be practiced. These embodiments are described in sufficient detail to enable those skilled in the art to practice presently disclosed systems and methods, and it is to be understood that other embodiments may be utilized and that structural and logical changes may be made without departing from the spirit and scope of the disclosure. Moreover, for the purpose of clarity, detailed descriptions of certain features will not be discussed when they would be apparent to those with skill in the art so as not to obscure the description of embodiments of the disclosure. The following detailed description is therefore not to be taken in a limiting sense, and the scope of the disclosure is defined only by the appended claims.

Information in a volatile memory device may be stored in memory cells (e.g., as a charge on a capacitive element), and may decay over time. The memory cells may be organized into rows (word lines) and columns (bit lines), and the memory cells may be refreshed on a row-by-row basis. In order to prevent information from being lost or corrupted due to this decay, the memory may carry out refresh operations. During a refresh operation, information may be rewritten to the word line to restore its initial state. Auto refresh operations may be performed on the word lines of the memory in a sequence such that over time each of the word lines of the memory are refreshed at a rate faster than the expected rate of data degradation.

Repeated access to a particular row of memory (e.g., an aggressor row) may cause an increased rate of decay in rows (e.g., victim rows) which are close to the aggressor row. These repeated accesses may be part of a deliberate attack against the memory and/or may be due to 'natural' access patterns of the memory. The increased rate of decay in the victim rows may require that they be refreshed as part of a targeted refresh operation. The memory device may periodically perform targeted refresh operations. The targeted refresh operations may be in addition to the auto refresh operations. For example, the memory device may perform a set of refresh operations including a number of auto refresh operations, and a number of targeted refresh operations and then repeat this cycle. In some embodiments, the targeted refresh operations may 'steal' timeslots which would otherwise be used for auto refresh operations. A memory device may generally cycle between performing access operations for a period of time, performing refresh operations for a period of time, performing access operations and so forth.

A refresh signal may control a timing of the refresh operations. The refresh signal may be activated responsive to a refresh command. The refresh signal may be activated multiple times responsive to the refresh command. These multiple activations may be referred to as 'pumps.' A refresh operation may be performed responsive to each pump. The refresh operations performed responsive to multiple pumps associated with the refresh command may be referred to as a multi pump refresh operation.

Responsive to the activation of the refresh signal, the memory banks may be capable of performing more than one type of refresh operation such as auto refresh operations and/or targeted refresh operations. Some types of refresh operations may simultaneously refresh multiple rows. By simultaneous, it is meant at or nearly the same time, such that the refresh operation of multiple rows completely or nearly completely overlap in time. Refreshing multiple rows simultaneously may reduce the time required to refresh all of the rows in the memory. The rows may be located in the same or different banks. For example, multiple rows in each bank may be refreshed simultaneously. In another example, one row in each bank may be refreshed simultaneously. Some types of refresh operations may simultaneously refresh more rows than other types of refresh operations.

FIG. 1A illustrates an example of two different refresh operations in a memory device. The memory device 100 includes a memory array divided into sixteen memory banks BK0-15. Responsive to a pump of a refresh operation Pump A, eight rows (e.g., word lines), indicated by the thick lines in FIG. 1A, are refreshed in each of the banks. In some examples, the refresh operation performed responsive to Pump A may be an auto refresh operation. Responsive to another pump of the refresh operation Pump B, one row is refreshed in each of the banks. In some examples, the refresh operation performed responsive to Pump B may be a targeted refresh operation where victim rows of aggressor rows from a row hammer attack are refreshed. As illustrated, responsive to Pump A, 128 rows in memory device 100 are refreshed whereas only 16 rows are refreshed responsive to Pump B.

Figure 1B:
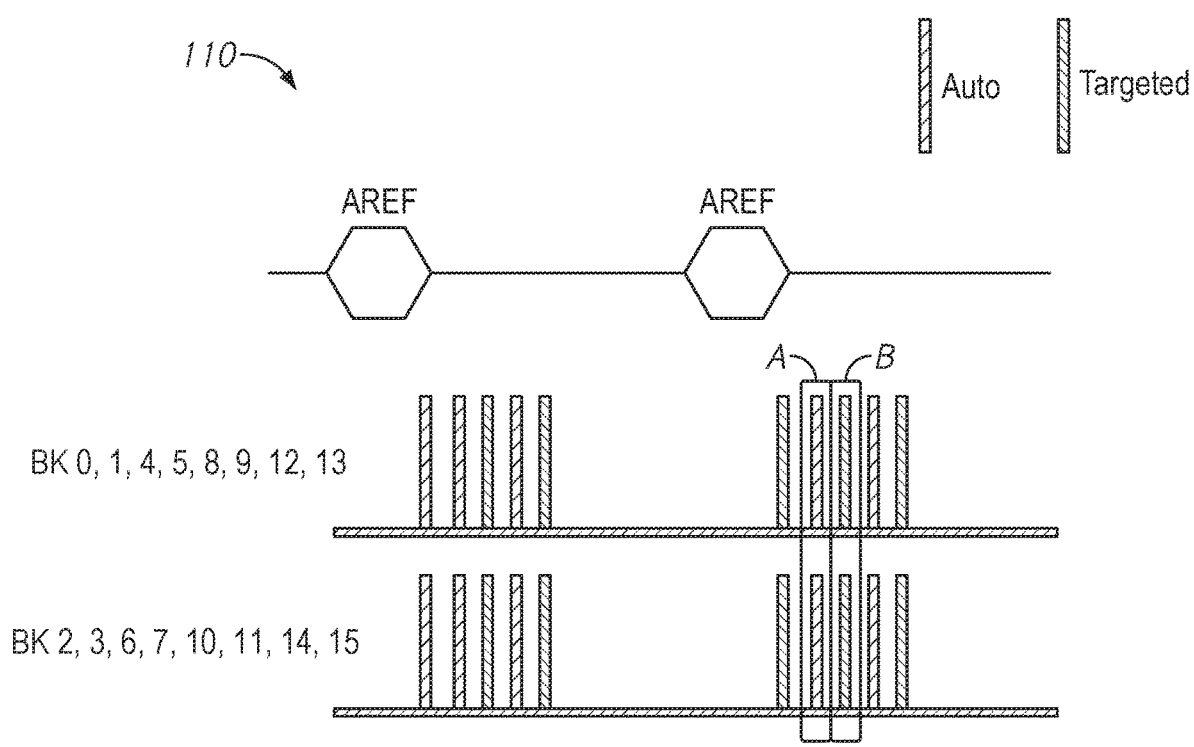
FIG. 1B is an example timing diagram of refresh operations in the memory device of FIG. 1A.

FIG. 1B is an example timing diagram of refresh operations in the memory device of FIG. 1A. In timing diagram 110, the top row illustrates when refresh commands AREF are received. The second and third lines of timing diagram 110 illustrate refresh activation signals (e.g., pumps) provided to the banks BK0-15 of memory device 100, illustrated as vertical lines. In the example shown in FIG. 1B, the pumps are associated with one of two types of refresh operations: auto refresh and targeted refresh. Different refresh states of Pump A and Pump B shown in FIG. 1A correspond to the phase of boxes A and B in FIG. 1B, respectively. As shown in both FIGS. 1A and 1B, the same type of refresh operation is performed on all of the banks during each pump.

Refreshing a large number of rows at a time as shown in FIGS. 1A and 1B may cause an increase in peak current draw. High peak currents may lead to undesirable voltage drops after the refresh operations, which may cause errors in subsequent operations. Accordingly, it may be desirable to reduce the number of rows that are refreshed simultaneously during a refresh operation.

The present disclosure is drawn to apparatuses, systems, and methods for performing multiple types of refresh operations responsive to a pump of the refresh signal. Different types of refresh operations may be performed on different portions of a memory responsive to a pump. For example, one type of refresh operation (e.g., auto refresh) may be performed on one or more rows and another type of refresh operation (e.g., targeted refresh) may be performed on one or more other rows responsive to the pump. In some embodiments, one type of refresh operation may be performed on some memory banks while another type of refresh operation may be performed on other memory banks responsive to a pump. Responsive to a subsequent pump, the different types of refresh operations may be performed on the memory banks. In some embodiments, what refresh operation type is performed on the memory banks may alternate responsive to the pumps. By performing different types of refresh operations responsive to a pump, a peak number of rows refreshed responsive to a pump may be reduced. This may in turn reduce a peak current draw by the memory device.

While other techniques, such as time staggering of refresh operations across rows, banks, arrays, and/or die, have been used to reduce peak current draw, these techniques require significant control circuitry. This may require an increase in design and/or fabrication complexity. The extensive control circuitry may also require a large layout area, particularly when significant control circuitry is required at the bank logic level—the circuitry provided to control an individual bank. When required at the bank logic level, the control circuitry may be required to be replicated for each bank. In contrast, in some embodiments, the different refresh operations performed on different rows during pumps may be achieved with minimal additional control circuitry. In some embodiments, the control circuitry of the present disclosure may include a counter circuit (e.g., one-bit counter circuit) to generate control signals to cause different types of refresh operations to be performed on different banks. In some embodiments, the control circuitry of the present disclosure may not be required at the bank logic level. Thus, the control circuitry of the present disclosure may be shared by multiple banks in some embodiments.

Figure 2:
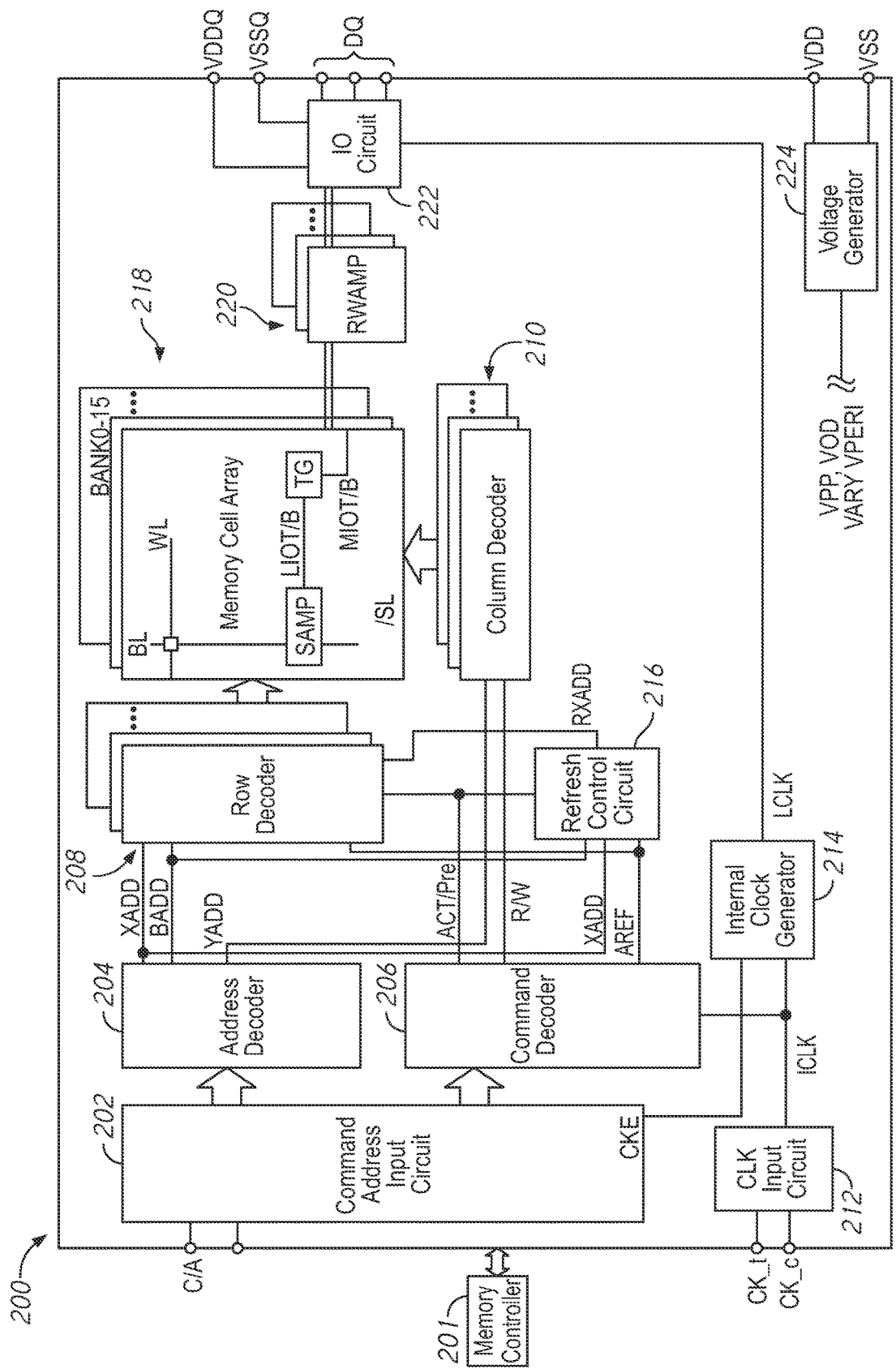
FIG. 2 is a block diagram of a semiconductor device according to an embodiment of the present disclosure.

FIG. 2 is a block diagram of a semiconductor device according an embodiment of the disclosure. The semiconductor device 200 may be a semiconductor memory device, such as a DRAM device integrated on a single semiconductor chip.

The semiconductor device 200 includes a memory array 218. The memory array 218 is shown as including a plurality of memory banks. In the embodiment of FIG. 2, the memory array 218 is shown as including sixteen memory banks BANK0-BANK15. More or fewer banks may be included in the memory array 218 of other embodiments. Each memory bank includes a plurality of word lines WL, a plurality of bit lines BL and /BL, and a plurality of memory cells MC arranged at intersections of the plurality of word lines WL and the plurality of bit lines BL and /BL. The selection of the word line WL is performed by a row decoder circuit 208 and the selection of the bit lines BL and /BL is performed by a column decoder circuit 210. In the embodiment of FIG. 2, the row decoder circuit 208 includes a respective row decoder circuit for each memory bank and the column decoder circuit 210 includes a respective column decoder for each memory bank. The bit lines BL and /BL are coupled to a respective sense amplifier (SAMP). Read data from the bit line BL or /BL is amplified by the sense amplifier SAMP, and transferred to read/write amplifiers 220 over complementary local data lines (LIOT/B), transfer gate (TG), and complementary main data lines (MIOT/B). Conversely, write data outputted from the read/write amplifiers 220 is transferred to the sense amplifier SAMP over the complementary main data lines MIOT/B, the transfer gate TG, and the complementary local data lines LIOT/B, and written in the memory cell MC coupled to the bit line BL or /BL.

The semiconductor device 200 may employ a plurality of external terminals that include command and address (C/A) terminals coupled to a command and address bus to receive commands and addresses, and a CS signal, clock terminals to receive clocks CK_t and CK_c, data terminals DQ to provide data, and power supply terminals to receive power supply potentials VDD, VSS, VDDQ, and VSSQ.

The clock terminals are supplied with external clocks CK_t and CK_c that are provided to an input circuit 212. The external clocks may be complementary. The input circuit 212 generates an internal clock ICLK based on the CK_t and CK_c clocks. The ICLK clock is provided to the command decoder circuit 210 and to an internal clock generator 214. The internal clock generator 214 provides various internal clocks LCLK based on the ICLK clock. The LCLK clocks may be used for timing operation of various internal circuits. The internal data clocks LCLK are provided to the input/output circuit 222 to time operation of circuits included in the input/output circuit 222, for example, to data receivers to time the receipt of write data.

The C/A terminals may be supplied with memory addresses. The memory addresses supplied to the C/A terminals are transferred, via a command/address input circuit 202, to an address decoder 204. The address decoder 204 receives the address and supplies a decoded row address XADD to the row decoder circuit 208 and supplies a decoded column address YADD to the column decoder circuit 210. The address decoder 204 may also supply a decoded bank address BADD, which may indicate the bank of the memory array 218 containing the decoded row address XADD and column address YADD. The C/A terminals may be supplied with commands. Examples of commands include access commands for accessing the memory, such as commands for performing read operations and commands for performing write operations. The access commands may be associated with one or more of a row address XADD, column address YADD, and/or bank address BADD to indicate the memory cell(s) to be accessed. In some embodiments, the commands and/or addresses may be provided by a component external to the device 200, for example, as shown in FIG. 2, a memory controller 201 in communication with the device 200.

The commands may be provided as internal command signals to a command decoder circuit 206 via the command/address input circuit 202. The command decoder circuit 206 includes circuits to decode the internal command signals to generate various internal signals and commands for performing operations. For example, the command decoder circuit 206 may provide a row command signal to select a word line and a column command signal to select a bit line.

The device 200 may receive access commands for performing read operations. When the commands are received, and a bank address, a row address and a column address are timely supplied with the commands, read data is read from memory cells in the memory array 218 corresponding to the row address and column address. The commands are received by the command decoder circuit 206, which provides internal commands so that read data from the memory array 218 is provided to the read/write amplifiers 220. The read data is output to outside from the data terminals DQ via the input/output circuit 222.

The device 200 may receive access commands for performing write operations. When the commands are received, and a bank address, a row address and a column address are timely supplied with the commands, write data supplied to the data terminals DQ is written to a memory cells in the memory array 218 corresponding to the row address and column address. The commands are received by the command decoder circuit 206, which provides internal commands so that the write data is received by data receivers in the input/output circuit 222. Write clocks may also be provided to the external clock terminals for timing the receipt of the write data by the data receivers of the input/output circuit 222. The write data is supplied via the input/output circuit 222 to the read/write amplifiers 120, and by the read/write amplifiers 220 to the memory array 218 to be written into the memory cell MC.

The device 200 may also receive commands causing it to carry out one or more refresh operations as part of a self-refresh mode. The device 200 may be periodically placed in a refresh mode. Thus, refresh operations may be performed periodically each time the memory device is in the refresh mode. In some embodiments, the refresh mode command may be externally issued to the memory device 200. In some embodiments, the refresh mode command may be periodically generated by a component of the device. In some embodiments, when an external signal indicates a refresh mode entry command (e.g., an external refresh command), the refresh signal AREF may also be activated. The refresh signal AREF may be a pulse signal which is activated when the command decoder circuit 206 receives a signal which indicates entry to the self-refresh mode. The refresh signal AREF may be activated once immediately after command input, and thereafter may be cyclically activated at desired internal timing. In some embodiments, the refresh signal AREF may cause more than one refresh operation to be performed, which may be referred to as a "multi pump" refresh. In some embodiments, the refresh signal AREF may be active during the refresh mode. In some embodiments, the refresh signal AREF may be active during the multiple refresh operations. The refresh signal AREF may be used to control the timing of refresh operations during the refresh mode. A self-refresh exit command may cause the automatic activation of the refresh signal AREF to stop and may cause the device 200 to return to an idle state and/or resume other operations.

The refresh signal AREF is supplied to the refresh control circuit 216. The refresh control circuit 216 supplies a refresh row address RXADD to the row decoder circuit 208, which may refresh one or more word lines WL indicated by the refresh row address RXADD. In some embodiments, the refresh address RXADD may represent a single word line. In some embodiments, the refresh address RXADD may represent multiple word lines, which may be refreshed sequentially or simultaneously by the row decoder circuit 208. In some embodiments, the number of word lines represented by the refresh address RXADD may vary from one refresh address to another. The refresh control circuit 216 may control a timing of the refresh operation, and may generate and provide the refresh address RXADD. The refresh control circuit 216 may be controlled to change details of the refreshing address RXADD (e.g., how the refresh address is calculated, the timing of the refresh addresses, the number of word lines represented by the address), or may operate based on internal logic.

The refresh control circuit 216 may selectively output a targeted refresh address (e.g., which specifies one or more victim address based on an aggressor) or an automatic refresh address (e.g., from a sequence of auto refresh addresses) as the refresh address RXADD. Based on the type of refresh address RXADD, the row decoder circuit 208 may perform a targeted refresh or auto refresh operation. The automatic refresh addresses may be from a sequence of addresses which are provided based on activations of the refresh signal AREF and/or pumps generated responsive to AREF. The refresh control circuit 216 may cycle through the sequence of auto refresh addresses at a rate determined by AREF. In some embodiments, the auto refresh operations may generally occur with a timing such that the sequence of auto refresh addresses is cycled such that no information is expected to degrade in the time between auto refresh operations for a given word line. In other words, auto refresh operations may be performed such that each word line is refreshed at a rate faster than the expected rate of information decay.

As used herein, an activation of a signal may refer to any portion of a signal's waveform to which that a circuit responds. For example, if a circuit responds to a rising edge, then a signal switching from a low level to a high level may be an activation. One example type of activation is a pulse, where a signal switches from a low level to a high level for a period of time, and then back to the low level. This may trigger circuits which respond to rising edges, falling edges, and/or signals being at a high logical level.

The refresh control circuit 216 may also determine targeted refresh addresses which are addresses that require refreshing (e.g., victim addresses corresponding to victim rows) based on the access pattern of nearby addresses (e.g., aggressor addresses corresponding to aggressor rows) in the memory array 218. The refresh control circuit 216 may use one or more signals of the device 200 to calculate the targeted refresh address. For example, the refresh address RXADD may be a calculated based on the row addresses XADD provided by the address decoder 204.

In some embodiments, the refresh control circuit 216 may sample the current value of the row address XADD provided by the address decoder 204 along a row address bus, and determine a targeted refresh address based on one or more of the sampled addresses. The sampled addresses may be stored in a data storage unit of the refresh control circuit. When a row address XADD is sampled, it may be compared to the stored addresses in the data storage unit. In some embodiments, the aggressor address may be determined based on the sampled and/or stored addresses. For example, the comparison between the sampled address and the stored addresses may be used to update a count value (e.g., an access count) associated with the stored addresses and the aggressor address may be calculated based on the count values. The refresh addresses RXADD may then be used based on the aggressor addresses.

While in general the present disclosure refers to determining aggressor and victim word lines and addresses, it should be understood that as used herein, an aggressor word line does not necessarily need to cause data degradation in neighboring word lines, and a victim word line does not necessarily need to be subject to such degradation. The refresh control circuit 216 may use some criteria to judge whether an address is an aggressor address, which may capture potential aggressor addresses rather than definitively determining which addresses are causing data degradation in nearby victims. For example, the refresh control circuit 216 may determine potential aggressor addresses based on a pattern of accesses to the addresses and this criteria may include some addresses which are not aggressors, and miss some addresses which are. Similar victim addresses may be determined based on which word lines are expected to be effected by aggressors, rather than a definitive determination of which word lines are undergoing an increased rate of data decay.

The refresh address RXADD may be provided with a timing based on a timing of the refresh signal AREF. During the periodic refresh operations of a refresh mode, the refresh control circuit 216 may have time slots corresponding to the timing of AREF, and may provide one or more refresh addresses RXADD during each time slot. In some embodiments, the targeted refresh address may be issued in (e.g., "steal") a time slot which would otherwise have been assigned to an auto refresh address. In some embodiments, certain time slots may be reserved for targeted refresh addresses, and the refresh control circuit 216 may determine whether to provide a targeted refresh address, not provide an address during that time slot, or provide an auto refresh address instead during the time slot.

The refresh control circuit 216 may use multiple methods to determine the timing of targeted refresh operations. The refresh control circuit 216 may have periodic targeted refresh operations during a refresh mode, where the refresh control circuit 216 performs auto refresh operations and targeted refresh operations (e.g., by providing a targeted refresh address as the refresh address RXADD) based on a periodic schedule. For example, after entering a refresh mode, the refresh control circuit 216 may perform a certain number of auto refresh operations, and then perform (e.g., steal) a certain number of targeted refresh operations. For multi pump refresh operations, each time the active refresh signal AREF is received, the refresh control circuit 216 may perform M different refresh operations, by providing M different refresh addresses RXADD. The refresh control circuit 216 may have a fixed pattern where some pumps are assigned to auto refresh operation and some pumps are assigned to targeted refresh operations.

In some embodiments, the pumps assigned to auto refresh operations and the pumps assigned to targeted refresh operations may be different for different portions of the memory array 218. The portions may be defined by one or more of word lines, refresh addresses RXADD, and/or banks. For example, in some embodiments, responsive to a pump of a multi pump refresh operation, an auto refresh operation may be performed on some banks (e.g., BANK0-7) while a targeted refresh operation may be performed on other banks (e.g., BANK8-15). Continuing this example, in banks BANK0-7 row addresses associated with auto refresh addresses may be refreshed and banks BANK8-15 row addresses associated with targeted refresh addresses may be refreshed. Responsive to a subsequent pump of the multi pump refresh operation, in banks BANK0-7 a targeted refresh operation may be performed and in banks BANK8-15 an auto refresh operation may be performed. The appropriate refresh addresses RXADD for each pump may be provided for the banks by the refresh control circuit 216.

As noted, some refresh operation types refresh more word lines than others responsive to a pump. In some embodiments, refresh addresses RXADD associated with auto refresh operations may correspond to more word lines than refresh addresses RXADD associated with targeted refresh operations. For example, multiple word lines per bank (e.g., 4, 8, 16) may be associated with refresh addresses RXADD for auto refresh operations whereas refresh addresses RXADD associated with targeted refresh operations may correspond to one word line per bank. Thus, by performing multiple types of refresh operations (e.g., both auto refresh and targeted refresh) responsive to a pump, a peak number of word lines refreshed responsive to the pump may be reduced. This may reduce peak current consumption by device 200 in some applications.

The power supply terminals are supplied with power supply potentials VDD and VSS. The power supply potentials VDD and VSS are supplied to an internal voltage generator circuit 224. The internal voltage generator circuit 224 generates various internal potentials VPP, VOD, VARY, VPERI, and the like based on the power supply potentials VDD and VSS supplied to the power supply terminals. The internal potential VPP is mainly used in the row decoder circuit 208, the internal potentials VOD and VARY are mainly used in the sense amplifiers SAMP included in the memory array 218, and the internal potential VPERI is used in many peripheral circuit blocks.

The power supply terminals are also supplied with power supply potentials VDDQ and VSSQ. The power supply potentials VDDQ and VSSQ are supplied to the input/output circuit 222. The power supply potentials VDDQ and VSSQ supplied to the power supply terminals may be the same potentials as the power supply potentials VDD and VSS supplied to the power supply terminals in an embodiment of the disclosure. The power supply potentials VDDQ and VSSQ supplied to the power supply terminals may be different potentials from the power supply potentials VDD and VSS supplied to the power supply terminals in another embodiment of the disclosure. The power supply potentials VDDQ and VSSQ supplied to the power supply terminals are used for the input/output circuit 122 so that power supply noise generated by the input/output circuit 222 does not propagate to the other circuit blocks.

In some embodiments, some components of device 200 may be shared by the banks BANK0-15 (e.g., associated with multiple banks, provided for multiple banks). That is, the components may provide signals for controlling operations for multiple banks BANK0-15. In the example shown in FIG. 2, the address decoder 204 and command decoder 206 may provide signals for operations in all of banks BANK0-15. In some embodiments, some components may be provided for subsets of banks BANK0-15 and/or each bank BANK0-15 of memory array 218 (e.g., associated with subsets of banks or associated with individual banks). These components may provide signals for controlling operations for a particular bank or subset of banks BANK0-15. In the example shown in FIG. 2, a row decoder circuit 208, a column decoder circuit 210, and read/write amplifiers 220 are provided for each bank BANK0-15. While only one refresh control circuit 216 is shown in FIG. 2, in some embodiments, separate refresh control circuits 216 may be provided for each bank BANK0-15. In some embodiments, some components of the device 200 may include portions that are provided for individual banks BANK0-15 while other portions are shared amongst multiple banks BANK0-15. For example, as will be described in more detail herein, the refresh control circuit 216 may include separate components for each bank BANK0-15 for determining targeted refresh addresses for each bank, and may include a shared component for providing one or more control signals for performing refresh operations.

Figure 3:
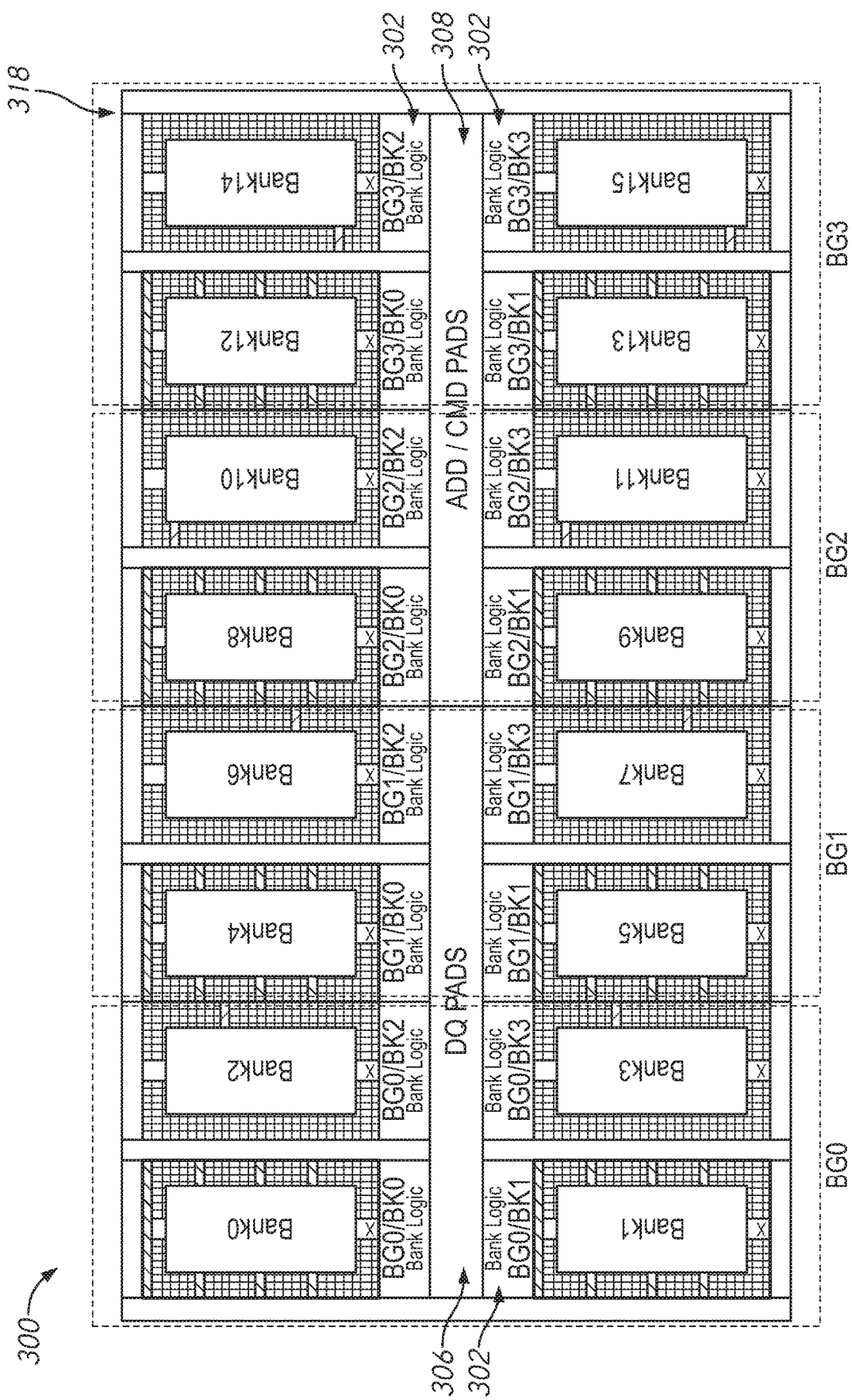
FIG. 3 is an example layout diagram of at least a portion of a semiconductor device according to an embodiment of the present disclosure.

FIG. 3 is an example layout diagram of at least a portion of a semiconductor device according to an embodiment of the present disclosure. The semiconductor device 300 may be included in semiconductor device 200 in some embodiments. The semiconductor device 300 may include a memory array 318. The memory array 318 may be included in the memory array 218 of FIG. 2 in some embodiments. The memory array 318 includes a number of memory banks Banks0-15, which are arranged into memory bank groups BG0-3. In the example shown in FIG. 3, the memory array 318 includes sixteen banks arranged into four groups: Bank0-3 in group BG0, Bank4-7 in group BG1, Bank8-11 in group BG2, and Bank12-15 in group BG3. Other numbers of memory banks and/or memory bank groups and/or different arrangements of the memory bank groups may be used in other examples. For example, the banks assigned to a memory bank group need not be physically adjacent to one another.

In some embodiments, the memory banks and/or groups may be physically separated from each other by one or more peripheral regions of the device 300. The peripheral regions may include various components of the memory such as bank logic 302, DQ pads 306, and C/A pads (e.g., terminals) 308. Additional circuitry may also be included in the peripheral regions in some embodiments such as a command/address input circuit, address decoder, and/or command decoder (not shown, see e.g., FIGS. 2, 4, and 5). The circuitry of the peripheral regions may transmit and receive signals to the banks Bank0-15 for performing various memory operations (e.g., read, write, refresh). As will be described in more detail herein, in some embodiments, components provided for individual banks may be included in the bank logic 302 and components provided for multiple banks may be included in other portions of the peripheral regions. However, in other embodiments, components provided for multiple banks may be included in one or more of the bank logic 302 and components provided for individual banks may be located outside the bank logic 302.

Each memory bank Bank0-15 includes a number of word lines and bit lines, with a number of memory cells arranged at the intersections. In some embodiments, there may be further organization of the rows (word lines) and columns (bit lines) within the banks Bank0-15. For example, each bank Bank0-15 may include a number of memory mats (not shown) each containing a number of rows and columns. The mats may be organized into mat sets. During an auto refresh operation, an address may be provided which causes a word line in each mat in one or more of banks Bank0-15 to refresh. Thus, the number of word lines refreshed during an auto refresh operation may be based, at least in part, on a number of mats in each bank Bank0-15.

In some embodiments, refresh commands may be issued in common to all of the banks Bank0-15, and refresh operations may be performed simultaneously on all of the banks Bank0-15 responsive to one or more refresh signals, for example, pumps of a refresh signal responsive to a refresh command. In some embodiments, different refresh signals may be provided to the banks Bank0-15 that include an indication of a type of refresh operation to be performed (e.g., auto or targeted). Thus, responsive to a particular pump, in some of the banks Bank0-15 one type of refresh operation may be performed while in other banks Bank0-15 another type of refresh operation may be performed simultaneously. For example, bank groups BG0 and BG2 may receive a refresh signal indicating an auto refresh operation is to be performed responsive to a pump and bank groups BG1 and BG3 may receive a refresh signal indicating a targeted refresh operation is to be performed responsive to the pump. Performing an auto refresh operation may include refreshing word lines associated with auto refresh addresses and performing a targeted refresh operation may include refreshing word lines associated with targeted refresh addresses. Other divisions of the refresh operation types between banks may also be used (e.g., even versus odd banks, separate signals for each bank group, etc.).

Each of the banks Bank0-15 may be associated with a refresh control circuit (not shown in FIG. 3, see e.g., refresh control circuit 216 of FIG. 2) or a portion of a refresh control circuit, which may issue various refresh control signals and refresh addresses to that bank Bank0-15. The refresh control circuit(s) may be included in a peripheral region of the device 300. In some embodiments, a portion or portions of the refresh control circuit(s) may be included in the bank logic 302 or other region proximate the banks Bank0-15. As will be described in more detail herein, the refresh control circuit(s) may receive activations of AREF and may use one or more internal logic circuits to determine what refresh control signal to provide to indicate a refresh operation type and what refresh address to provide to individual ones of banks Bank0-15. For example, the refresh control circuit(s) may determine if the refresh address provided to individual ones of banks Bank0-15 should indicate an auto refresh operation, a targeted refresh operation, or another type of refresh operation for a particular pump of a refresh operation. In some embodiments, the type of refresh operation indicated by the refresh control signals and refresh address provided to a bank may vary with different pumps of a refresh operation.

Figure 4:
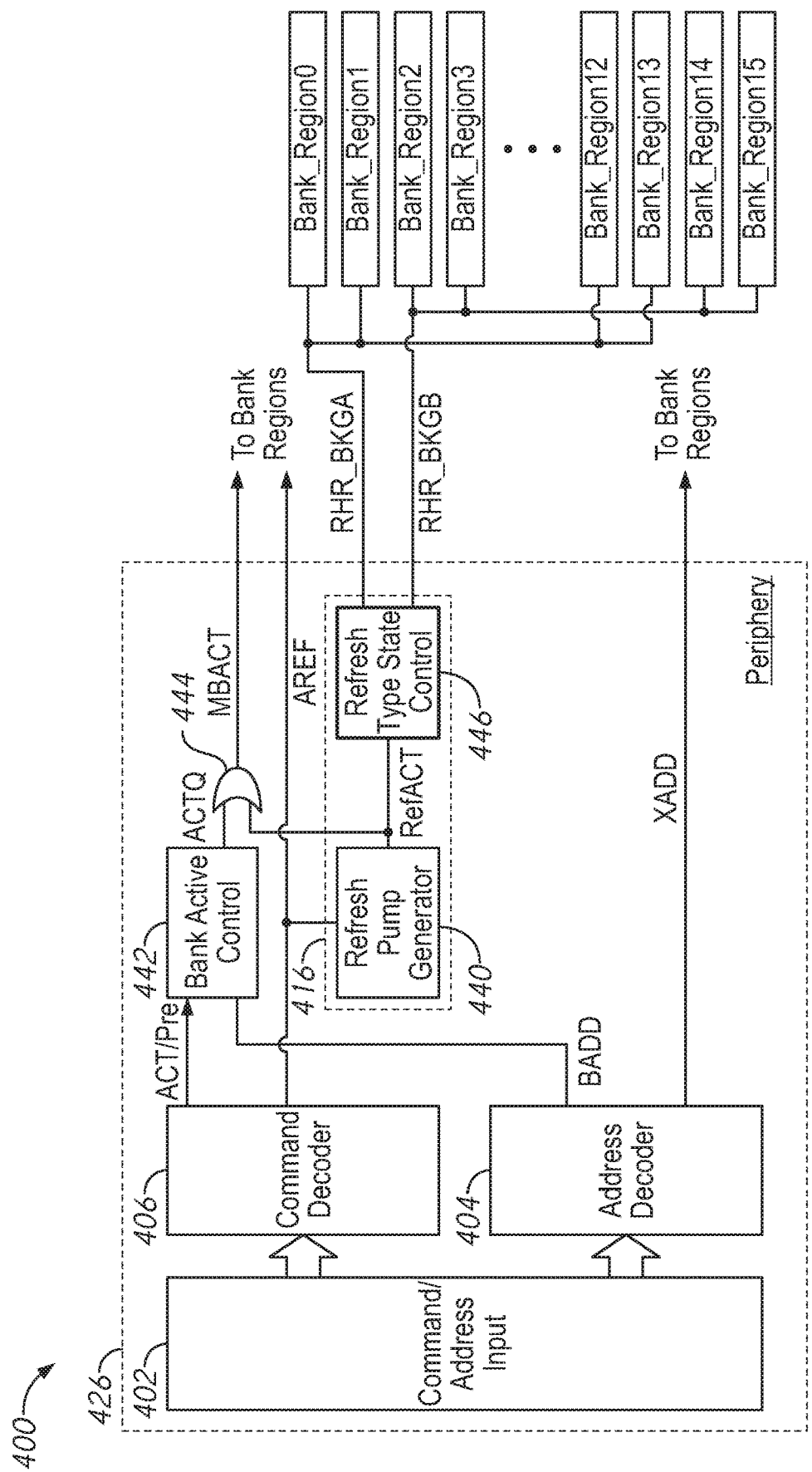
FIG. 4 is a block diagram of at least a portion of a semiconductor device according to an embodiment of the disclosure.

FIG. 4 is a block diagram of at least a portion of a semiconductor device according to an embodiment of the disclosure. In some embodiments, the semiconductor device 400 may be included in semiconductor device 200 and/or semiconductor device 300. The semiconductor device 400 may include a peripheral region 426 and one or more bank regions Bank_Region0-15. The peripheral region 426 may include one or more components for providing signals to and receiving signals from the bank regions Bank_Region0-15 for performing memory operations. The individual bank regions Bank_Region0-15 may include a memory bank (e.g., memory banks BANK0-15 of FIG. 2 and/or memory banks memory banks Banks0-15 of FIG. 3) as well as one or more components for providing signals to and receiving signals from the memory bank. In some embodiments, bank regions Bank_Region0-15 may include at least a portion of the bank logic (e.g., bank logic 302) for the memory bank. Although sixteen bank regions are illustrated in the example shown in FIG. 4, more or fewer bank regions may be included in other examples.

In some embodiments, the peripheral region 426 may include a command/address input circuit 402, address decoder circuit 404, command decoder circuit 406. In some embodiments, the command/address input circuit 402 may be included in command/address input circuit 102, the address decoder circuit 404 may be included in address decoder circuit 104, and the command decoder circuit 406 may be included in command decoder circuit 106. In some embodiments, the peripheral region 426 may further include a bank active control circuit 442, control logic circuit 444, and at least a portion of a refresh control circuit 416.

The bank active control circuit 442 may receive an activation and/or precharge signal ACT/Pre from the command decoder 406 and a bank address BADD from the address decoder 404. When an active ACT signal is provided from the command decoder 406, the bank active control circuit 442 may provide an activation control signal ACTQ based, at least in part, on the bank address BADD. The ACTQ signal may be received by control logic circuit 444, which may also receive a refresh activation signal RefACT. The control logic circuit 444 may provide an active memory bank activation signal MBACT when either the ACTQ signal or the RefACT signal is active. The bank activation signal MBACT may activate the appropriate bank(s) in the bank regions Bank_Region0-15. In the example shown in FIG. 4, the control logic circuit 444 includes an OR logic circuit. However, in other examples, alternative logic may be used.

As will be described in further detail with reference to FIG. 5, the refresh control circuit 416 may be a portion of a refresh control circuit in some embodiments. The refresh control circuit 416 may include a refresh pump generator circuit 440 and a refresh type state control circuit 446 in some embodiments. The refresh pump generator circuit 440 may receive a refresh signal AREF from the command decoder 406. In some embodiments, an active refresh signal AREF may be provided responsive to a refresh command, which may be externally (e.g., received from a memory controller) or internally generated. Responsive to an active refresh signal AREF, the refresh pump generator circuit 440 may provide one or more activations of a refresh activation signal RefACT. An activation of the RefACT signal may be referred to as a "pump" of the RefACT signal. In some embodiments, the refresh pump generator circuit 440 may provide multiple pumps of the RefACT responsive to an active AREF signal. The RefACT signal may be provided to the control logic circuit 444 as noted above, and the refresh type state control circuit 446. As will be described in more detail with reference to FIG. 5, the AREF signal may also be provided to the bank regions Bank_Region0-15 in some embodiments.

The refresh type state control circuit 446 may provide signals to the bank regions Bank_Region0-15 to indicate a type of refresh operation performed by the memory banks of the corresponding bank regions Bank_Region0-15. The respective memory banks of the respective bank regions Bank_Region0-15 may perform a refresh operation of a type indicated by the refresh state control signal. This may allow different types of refresh operations to be performed on different banks responsive to a pump of the RefACT signal. In the example shown in FIG. 4, the refresh type state control circuit 446 provides two different refresh type signals RHR_BKGA, RHR_BKGB to the bank regions Bank_Region0-15. The refresh type signals RHR_BKGA, RHR_BKGB may be provided with one state to indicate one type of refresh operation and another state to indicate another type of refresh operation. For example, a low logic state (e.g., '0') may indicate an auto refresh operation and a high logic state (e.g., '1') may indicate a targeted refresh operation.

The refresh type signal RHR_BKGA may be provided to one group of banks of the bank regions Bank_Region0-15 and refresh type signal RHR_BKGB may be provided to another group of banks of the bank regions Bank_Region0-15. In the example shown in FIG. 4, refresh type signal RHR_BKGA is provided to bank regions Bank_Region0, Bank_Region1, Bank_Region4, Bank_Region5, Bank_Region8, Bank_Region9, Bank_Region12, and Bank_Region13 and refresh type signal RHR_BKGB is provided to bank regions Bank_Region2, Bank_Region3, Bank_Region6, Bank_Region7, Bank_Region10, Bank_Region11, Bank_Region14, and Bank_Region15. Other divisions between the refresh type signals may be used in other examples (e.g., RHR_BKGA may be provided to Bank_Regions0-7 and RHR_BKGB may be provided to Bank_Regions8-15). Furthermore, although two refresh type signals are shown in FIG. 4, in other examples, more refresh type signal may be provided.

The refresh type state control circuit 446 may change the states of one or both of the refresh type signals RHR_BKGA, RHR_BKGB with different pumps of the RefACT signal. For example, responsive to a pump, the refresh type state control circuit 446 may provide RHR_BKGA with a first state and RHR_BKGB with a second state. Responsive to a subsequent pump, the Refresh type state control circuit 446 may provide RHR_BKGA with the second state and RHR_BKGB with the first state. The states of the refresh type signals RHR_BKGA, RHR_BKGB may be changed in a variety of manners (e.g., the states may change every pump or every other pump).

Thus, by providing different refresh type control signals to different bank regions for each pump, such as with refresh type state control circuit 446, different types of refresh operations may be performed simultaneously on different memory banks for a pump, and the type of refresh operation performed on different memory banks may be changed for different pumps of a multi pump refresh operation. More details of the components of the bank regions Bank_Regions0-15 will now be described.

Figure 5:
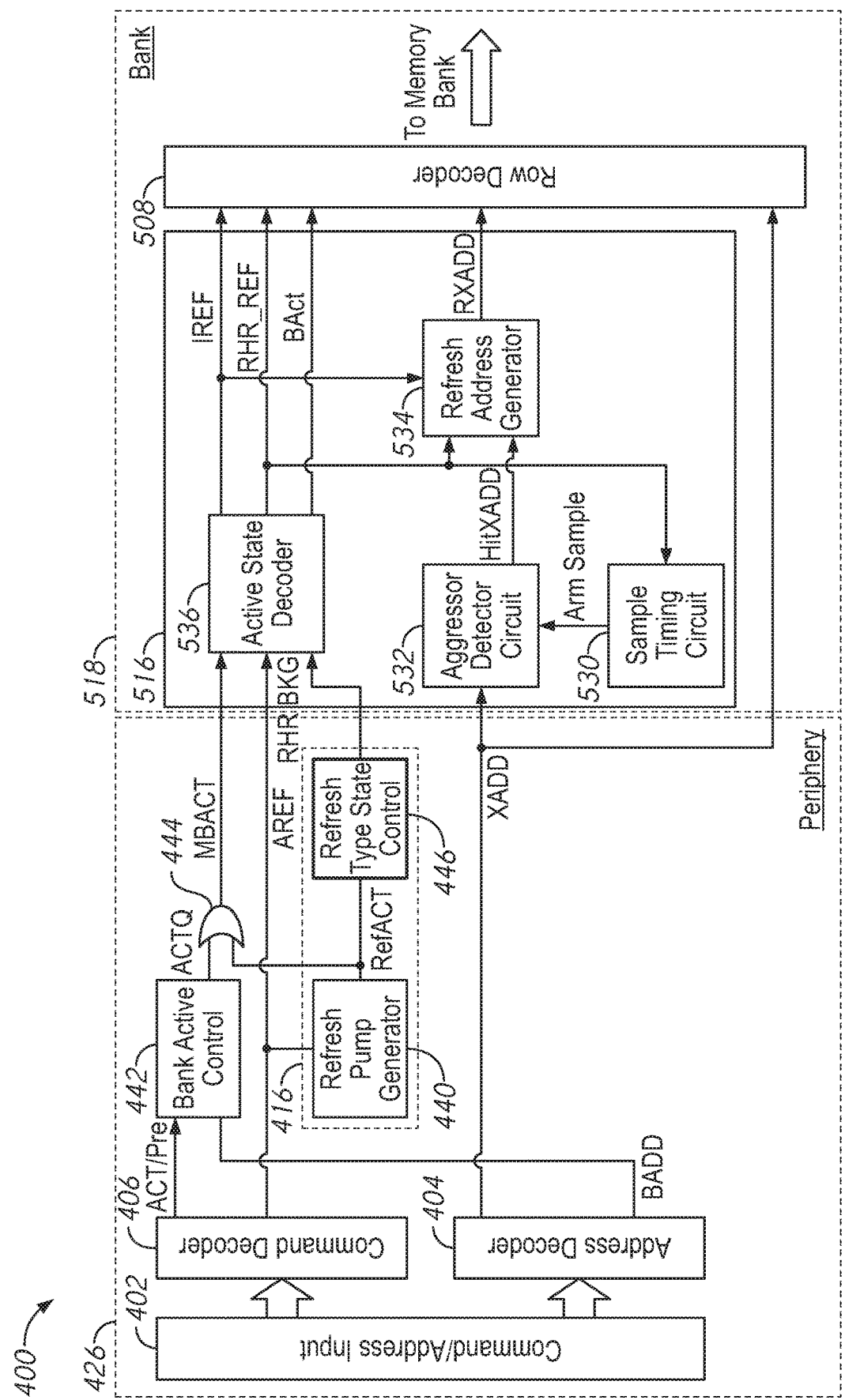
FIG. 5 is a block diagram of the semiconductor device of FIG. 4.

FIG. 5 is a block diagram of the semiconductor device of FIG. 4. The block diagram of FIG. 5 shows components of bank logic 518 of a bank region according to embodiments of the present disclosure. The bank logic 518 may include at least a portion of a row control circuit 516 and a row decoder circuit 508 in some embodiments. Bank logic 518 may be included in any one or more of bank regions Bank_Region0-15 shown in FIG. 4. In some embodiments, each bank region Bank_Region0-15 may include bank logic 518. That is, there may be multiple refresh control circuits 516 and/or row decoder circuits 508, such as one for each memory bank. For the sake of brevity, only components for a single bank logic 518 will be described.

The row control circuit 516 may include a sample timing circuit 530, an aggressor detector circuit 532, an active state decoder circuit 536 and a refresh address generator 534. Components of the peripheral region 426 may provide one or more control signals, such as a refresh signal AREF from the command decoder 406, a memory bank activation signal MBACT from the control logic circuit 444, a row address XADD from the address decoder 404, and a refresh type signal RHR_BKG (which may be RHR_BKGA or RHR_BKGB as shown in FIG. 4) from refresh type state control circuit 446 to the row control circuit 516. In some embodiments row control circuit 516 and refresh control circuit 416 may be included in refresh control circuit 216 shown in FIG. 2. That is, row control circuit 516 and refresh control circuit 416 may be portions of the refresh control circuit 216. In some embodiments, the components of refresh control circuit 416 may be shared by the bank regions while the components of row control circuit 516 are provided for individual bank regions. Although the refresh control circuit 416 provided for multiple bank regions is shown in the peripheral region 426 and the row control circuit 516 provided for individual bank regions is shown in the bank logic 518 of the bank regions in FIGS. 4 and 5, in other embodiments, the refresh control circuits 416, 516 may be located in other areas of the semiconductor device 400. For example, the refresh control circuit 416 may be located in one of the bank regions Bank_Region0-15 and coupled to the other bank regions.

The row control circuit 516 provides refresh addresses RXADD to the row decoder 508 with timing based at least in part on the refresh signal AREF and the refresh type signal RHR_BKG, where some of the refresh addresses are based on the received row address XADD. The row control circuit 516 may also provide additional control signals to the row decoder 508 as will be described in more detail.

The aggressor detector circuit 532 may sample the current row address XADD responsive to an activation of a sampling signal ArmSample. In some embodiments, the sampled addresses may be stored in the aggressor circuit 532 and/or compared to previously stored addresses. The aggressor detector circuit 532 may a match address HitXADD based on a currently sampled row address XADD and/or previously sampled row addresses. The active state decoder circuit 536 may provide an active targeted refresh signal RHR_REF to indicate that a targeted refresh operation (e.g., a refresh of the victim rows corresponding to an identified aggressor row, also referred to as a row hammer refresh) should occur. The active state decoder circuit 536 may also provide an internal refresh signal IREF, to indicate that an auto refresh should occur. Responsive to an activation of RHR_REF or IREF, the refresh address generator 534 may provide a refresh address RXADD, which may be an auto refresh address or may be one or more victim addresses corresponding to victim rows of the aggressor row corresponding to the match address HitXADD. The row decoder 508 may perform a refresh operation responsive to the refresh address RXADD and the active targeted refresh signal RHR_REF. The row decoder circuit 508 may perform an auto refresh operation based on the refresh address RXADD and the active internal refresh signal IREF. In some embodiments, the row decoder circuit 508 may be included in row decoder circuit 208.

In embodiments where row accesses are monitored by sampling (in contrast to monitoring every access operation) the sample timing circuit 530 provides the sample arming signal ArmSample. The signal ArmSample may be a binary signal which can be at a high logical level (which may be represented by a first voltage, such as VDD) or at a low logical level (which may be represented by a second voltage, such as ground or VSS). An activation of ArmSample may be a 'pulse', where ArmSample is raised to a high logic level and then returns to a low logic level. In some embodiments, the sample timing circuit 530 may use one or more mechanisms to regularly (e.g., non-random), randomly, semi-randomly, or pseudo-randomly determine whether to provide an activation of the signal ArmSample.

In some embodiments, the sample timing circuit 230 may receive the activation signal ACT/Pre or MBACT signal (not shown in FIG. 5). In some embodiments, activations of the signal ArmSample may further be based on the signal ACT/Pre to ensure that each activation of the signal ArmSample is associated with an access operation.

The aggressor detector circuit 532 may receive the row address XADD from the address decoder 404 and the signal ArmSample from the sample timing circuit 530. The row address XADD on the row address bus may change as the semiconductor device 400 directs access operations (e.g., read and write operations) to different rows of the memory cell array (e.g., memory cell array 218 of FIG. 2). Each time the aggressor detector circuit 532 receives an activation (e.g., a pulse) of the signal ArmSample, the aggressor detector circuit 532 may sample the current value of XADD. In some embodiments, the aggressor detector circuit 532 may provide the currently sampled value of XADD as the match address HitXADD. The refresh address generator 534 may provide one or more victim addresses associated with the match address HitXADD as the refresh address RXADD.

In some embodiments, responsive to an activation of the signal ArmSample, the aggressor detector circuit 532 may determine if one or more rows is an aggressor row based on the sampled row address XADD, and may provide identified aggressor rows as the match address HitXADD. As part of this determination, the aggressor detector circuit 532 may record (e.g., by latching in a register and/or otherwise storing) the current value of XADD responsive to the activation of ArmSample. The current value of XADD may be compared to previously recorded addresses in the aggressor detector circuit 532 (e.g., the addresses stored in the latch/register), to determine access patterns over time of the sampled addresses. If the aggressor detector circuit 532 determines that an address (which, in some embodiments, may be either the current address or a previously stored address) is an aggressor address, then the identified aggressor may be provided as a match address HitXADD. In some embodiments, the match address HitXADD may be provided responsive to the signal ArmSample. In some embodiments, the match address (e.g., aggressor address) HitXADD may be stored in a latch circuit for later retrieval by the refresh address generator 534 when the refresh address generator 534 determines a match address is needed.

In one example embodiment, in order to determine if the current address XADD is an aggressor address, the sampled value of the current row address XADD may be stored (e.g., latched in a latch circuit). The activation of ArmSample may also cause the aggressor detector circuit 532 to compare the currently sampled row address XADD to the previously stored addresses in the aggressor detector circuit 532. If the current row address XADD matches a stored address, the current row address XADD may be provided as the match address HitXADD.

In another example embodiment, the aggressor detector circuit 532 may store the value of sampled addresses in a register, and may have a counter associated with each of the stored addresses. When ArmSample is activated, if the current row address XADD matches one of the stored addresses, the value of the counter may be incremented. Responsive to the activation of ArmSample, the aggressor detector circuit 532 may provide the address associated with the highest value counter as the match address HitXADD. Other methods of identifying aggressor addresses may be used in other examples.

In embodiments where every row access command is monitored, the sample timing circuit 530 may be omitted. In these embodiments, the aggressor detector circuit 532 may perform the functions above responsive to the ACT/Pre signal rather than the ArmSample signal.

The active state decoder circuit 536 may receive the refresh signal AREF, the memory bank activation signal MBACT, and provide the row hammer refresh signal RHR_REF. The refresh signal AREF may be periodically generated and may be used to control the timing of refresh operations. A sequence of auto refresh operations may be carried out on the memory bank (not shown, see e.g., BANK0-15 of FIG. 2 and BANK0-15 of FIG. 3) in order to periodically refresh the rows of the memory bank. The RHR_REF signal may be activated in order to indicate that a particular targeted row (e.g., a victim row) of the bank should be refreshed instead of an address from the sequence of auto refresh addresses. The active state decoder circuit 536 may use internal logic to provide the RHR_REF signal. In some embodiments, the active state decoder circuit 536 may provide the RHR_REF signal based at least in part on the refresh type signal RHR_BKG. For example, when RHR_BKG is active, the active state decoder circuit 536 may provide an active RHR_REF signal. The active state decoder circuit 536 may also provide an active internal refresh signal IREF, which may indicate that an auto refresh operation should take place. In some embodiments, the signals RHR_REF and IREF may be generated such that they are not active at the same time (e.g., are not both at a high logic level at the same time).

In some embodiments, the active state decoder circuit 536 may provide an active RHR_REF signal and an inactive IREF signal when the RHR_BKG signal, the MBACT signal, and the AREF signal are active. In some embodiments, active state decoder circuit 536 may provide an inactive RHR_REF signal and an active IREF signal when the RHR_BKG signal is inactive and the MBACT and AREF signals are active. In some embodiments, both the RHR_REF and IREF signals may be inactive when MBACT or AREF are inactive, regardless of the state of the RHR_BKG signal. In some embodiments, the active state decoder circuit 536 may further pass the MBACT signal to the row decoder 508 as shown in FIG. 5, regardless of the states of any of the input signals. However, in other embodiments, the MBACT signal may be provided directly from the control logic circuit 444 to the row decoder circuit 508.

The refresh address generator 534 may receive the targeted refresh signal RHR_REF, the internal refresh signal IREF, and the match address HitXADD. The match address HitXADD may represent an aggressor row. The refresh address generator 534 may determine the locations of one or more victim rows based on the match address HitXADD and provide them as the refresh address RXADD when the signal RHR_REF indicates a targeted refresh operation. In some embodiments, the victim rows may include rows which are physically adjacent to the aggressor row (e.g., HitXADD+1 and HitXADD−1). In some embodiments, the victim rows may also include rows which are physically adjacent to the physically adjacent rows of the aggressor row (e.g., HitXADD+2 and HitXADD−2). Alternative or additional relationships between victim rows and the identified aggressor rows may be used in other examples. For example, +/−3, +/−4, and/or other rows may also or may alternatively be refreshed.

The refresh address generator 534 may determine the value of the refresh address RXADD based on the targeted refresh signal RHR_REF. In some embodiments, when the internal refresh signal IREF is active, the refresh address generator 534 may provide one of a sequence of auto refresh addresses. When the signal RHR_REF is active, the refresh address generator 534 may provide a targeted refresh address, such as a victim address, as the refresh address RXADD. In some embodiments, the refresh address generator 534 may count activations of the signal RHR_REF, and may provide closer victim rows (e.g., HitXADD+/−1) more frequently than victim rows which are further away from the aggressor address (e.g., HitXADD+/−2).

The row decoder 508 may perform one or more operations on the memory bank (not shown) based on the received signals and addresses. For example, responsive to the activation signal ACT and the row address XADD (and IREF and RHR_REF being inactive), the row decoder 508 may direct one or more access operations (for example, a read operation) on the specified row address XADD. Responsive to the RHR_REF or IREF signal being active, the row decoder 508 may refresh the refresh address RXADD.

When the refresh address RXADD is associated with an auto refresh operation, the refresh address RXADD may correspond to multiple word lines in the memory bank, for example, a row in each memory mat of the memory bank as discussed with reference to FIG. 3. In some embodiments, when the refresh address RXADD is associated with a targeted refresh operation, the refresh address RXADD may correspond to fewer word lines than the number of word lines associated with an auto refresh address, for example, one word line in the memory bank. When different refresh operation types (e.g., auto and targeted) are performed on different memory banks for a pump, more word lines (e.g., one word line for each mat) may be refreshed in some memory banks than in other memory banks (e.g., one word line in the bank). This may allow a number of word lines refreshed for a given pump in the memory array (e.g., memory array 218) to be reduced as the refreshing of multiple word lines per bank may be spread across multiple pumps of a multi pump refresh operation. This may reduce the peak current consumption of the semiconductor device 400.

In the example shown in FIGS. 4 and 5, the refresh type state control circuit 446 is shared amongst all of the bank Regions_0-15 and is used to provide control signals (e.g., RHR_BKG, RHR_BKGA, RHR_BKGB) to the bank regions Bank_Regions0-15 to cause different types of refresh operations to be performed responsive to pumps of a multi pump refresh operation. Thus, in some embodiments, there may be only one refresh type state control circuit 446 for all of the banks of a memory array (e.g., memory array 218) rather than a refresh type state control circuit 446 for each bank. This may reduce a number of additional circuits required to achieve the different types of refresh operations. Furthermore, in some embodiments, the refresh type state control circuit may be implemented with a circuit including relatively few components, for example as described with reference to FIG. 6.

Figure 6:
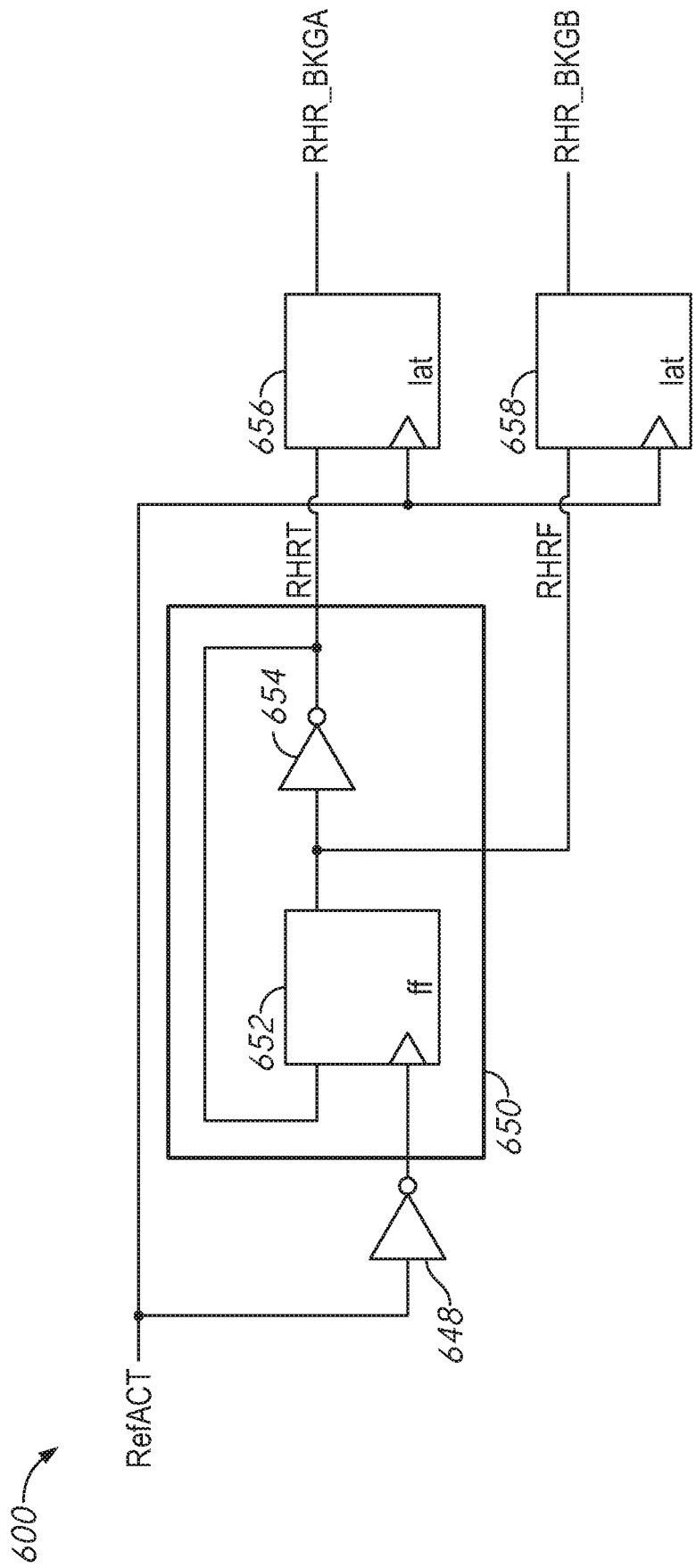
FIG. 6 is a block diagram of a refresh type state control circuit according to an embodiment of the disclosure.

FIG. 6 is a block diagram of a refresh type state control circuit according to an embodiment of the disclosure. The refresh type state control circuit 600 may be included in refresh type state control circuit 446 in some embodiments. The refresh type state control circuit 600 may include an inverter 648, a one-bit counter circuit 650, and latches 656, 658. The refresh type state control circuit 600 may receive a refresh activation signal RefACT, for example, from a refresh pump generator, such as refresh pump generator 440, and provide refresh type signals RHR_BKGA, RHR_BKGB to one or more bank regions, such as bank regions Bank_Regions0-15.

The inverter 648 may receive the RefACT signal as an input and provide the inverted RefACT signal as an output, which may be received by the one-bit counter circuit 650. The one-bit counter circuit 650 may include a flip-flop 652, which may receive the inverted RefACT signal from the inverter 648 as a clock input. The state of the flip-flop 652 may be provided as an input to inverter 654, which may provide the inverted state of the flip-flop 652 as an output, which may be provided as an output RHRT of the one-bit counter circuit 650. The non-inverted state of the flip-flop 652 may also be provided as an output RHRF of the one-bit counter circuit 650. In some embodiments, RHRT and RHRF may be complementary. The output of the inverter 654 may also be provided back to the flip-flop 652 as a data input. In operation, responsive to the pumps (e.g., activations) of the RefACT signal, the outputs RHRT and RHRF of the one-bit counter circuit 650 may transition between different states (e.g., low and high logic states, '0' and '1') with each pump.

The outputs RHRT and RHRF of the one-bit counter circuit 650 may be received by latches 656 and 658, respectively. The latches 656, 658 may be triggered by the RefACT signal. The latched signals from the one-bit counter circuit 650 may be output by the latches 656, 658 as refresh type signals RHR_BKGA and RHR_BKGB, respectively. When RHRT and RHRF are complementary, RHR_BKGA and RHR_BKGB may also be complementary. That is, RHR_BKGA and RHR_BKGB may have different states, which as discussed in reference to FIGS. 4 and 5, may correspond to different types of refresh operations. In some embodiments, the refresh type signal RHR_BKGA may be provided to different bank regions of a memory than the refresh type signal RHR_BKGB. Thus, different bank regions may perform different types of refresh operations responsive to a pump of the RefACT signal.

Figure 7:
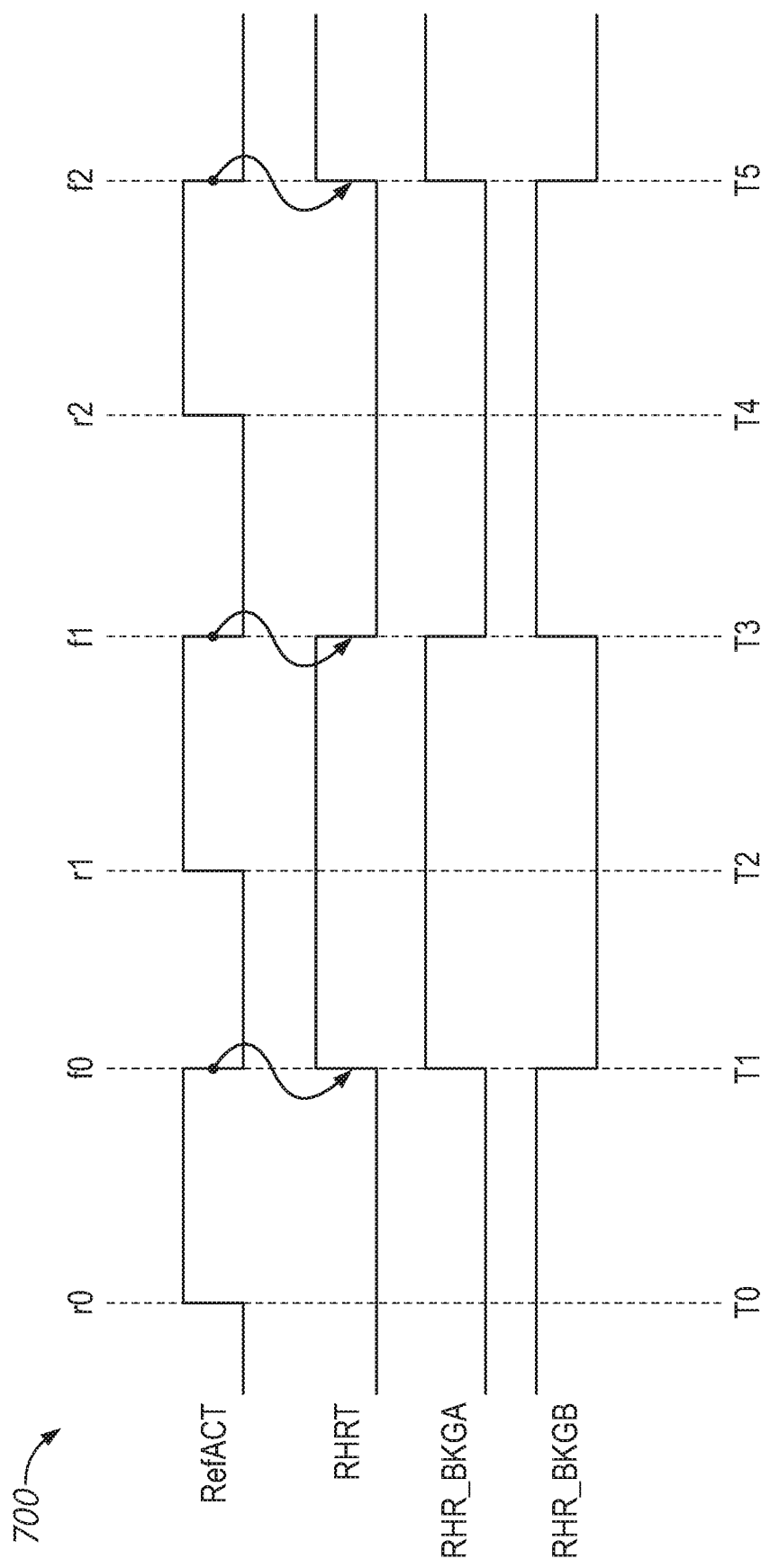
FIG. 7 is a timing diagram illustrating example operations of a memory device according to an embodiment of the present disclosure.

FIG. 7 is a timing diagram illustrating example operations of a memory device according to an embodiment of the present disclosure. The timing diagram 700 illustrates states of signals over time of various signals received and provided by a refresh type state control circuit, such as refresh type state control circuit 600 shown in FIG. 6. Although the states of the signals shown in FIG. 7 are not limited to the refresh type state control circuit 600, for illustrative purposes, reference will be made to refresh type state control circuit 600 to explain the features of timing diagram 700.

The first line of timing diagram 700 shows a state of a refresh activation signal RefACT, which may be provided by a refresh pump generator circuit, such as refresh pump generator circuit 440. The second line of timing diagram 700 shows a state of an output of a counter circuit, such as one-bit counter circuit 650. The third and fourth lines of timing diagram 700 show outputs of a refresh type state control circuit, such as refresh type state control circuit 600, and/or refresh type state control circuit 446.

The RefACT signal may have a rising edge r0 at or around a time T0. That is, RefACT may transition from a low logic state (e.g., inactive) to a high logic state (e.g., active). In some embodiments, the rising edge r0 may be responsive, at least in part, to a refresh signal AREF. At or around time T1, the RefACT signal may have a falling edge f0 where RefACT transitions from the high logic state to the low logic state. Responsive to the falling edge f0, the RHRT signal may transition from a low logic state to a high logic state at or around time T1. In some embodiments, the transition of RHRT may be responsive, at least in part, to the transition of an output from the inverter 648 provided to the flip-flop 652 from a low logic state to a high logic state. Although not shown in timing diagram 700, at or around time T1, RHRF may transition from a high logic state to a low logic state responsive to the transition of the RefACT signal.

Also at or around time T1, responsive to the transition of RHRT and RHRF, and the falling edge f0, RHR_BKGA may transition from a low logic state to a high logic state and RHR_BKGB may transition from a high logic state to a low logic state. In some embodiments, this may be due to the latches 656, 658 being triggered by the RefACT signal to latch the RHRT and RHRF signals, respectively. As shown in FIG. 7, the refresh type signal RHR_BKGA may have a different state than the refresh type signal RHR_BKGB. The different states may correspond to different refresh operation types. Thus, at bank regions receiving RHR_BKGA a different refresh operation type may be performed on memory banks than on memory banks of bank regions receiving RHR_BKGB in some embodiments.

At or around time T2, the RefACT signal may have a rising edge r1. The RHRT, RHRF, RHR_BKGA, and RHR_BKGB may maintain their current states. In some embodiments, this may be due to the flip-flop 552 not being triggered by a rising edge of the output of the inverter 548 and/or the latches 556, 558 not being triggered by rising edges of the RefACT signal in some embodiments. At or around time T3, the RefACT signal may have a falling edge f1. Responsive to the falling edge f1, the RHRT signal may transition from the high logic state to the low logic state. Responsive to the falling edge f1, the RHRT signal may transition from the high logic state to the low logic state at or around time T3. Although not shown, the RHRF signal may transition from the low logic state to the high logic state at or around time T3. Also at or around time T3, responsive to the transition of RHRT and RHRF, and the falling edge f1, RHR_BKGA may transition from the high logic state to the low logic state and RHR_BKGB may transition from the low logic state to the high logic state. As shown in FIG. 7, the refresh type signals RHR_BKGA, RHR_BKGB provided to the bank regions may change with each pump of the RefACT signal. Thus, at the different bank regions different refresh operations on the memory banks may be performed with different pumps of the RefACT signal in some embodiments.

As shown at times T4 and T5, the RefACT signal may continue to provide pumps, and the RHRT, RHR_BKGA, RHR_BKGB signals may transition in a similar manner as described with references to times T0-3. The number of pumps provided by RefACT may vary. For example, the number of pumps may be based on pre-programmed settings of a memory device, a number of pumps indicated by a refresh command, and/or one or more mode register settings of a memory device.

Figure 8A:
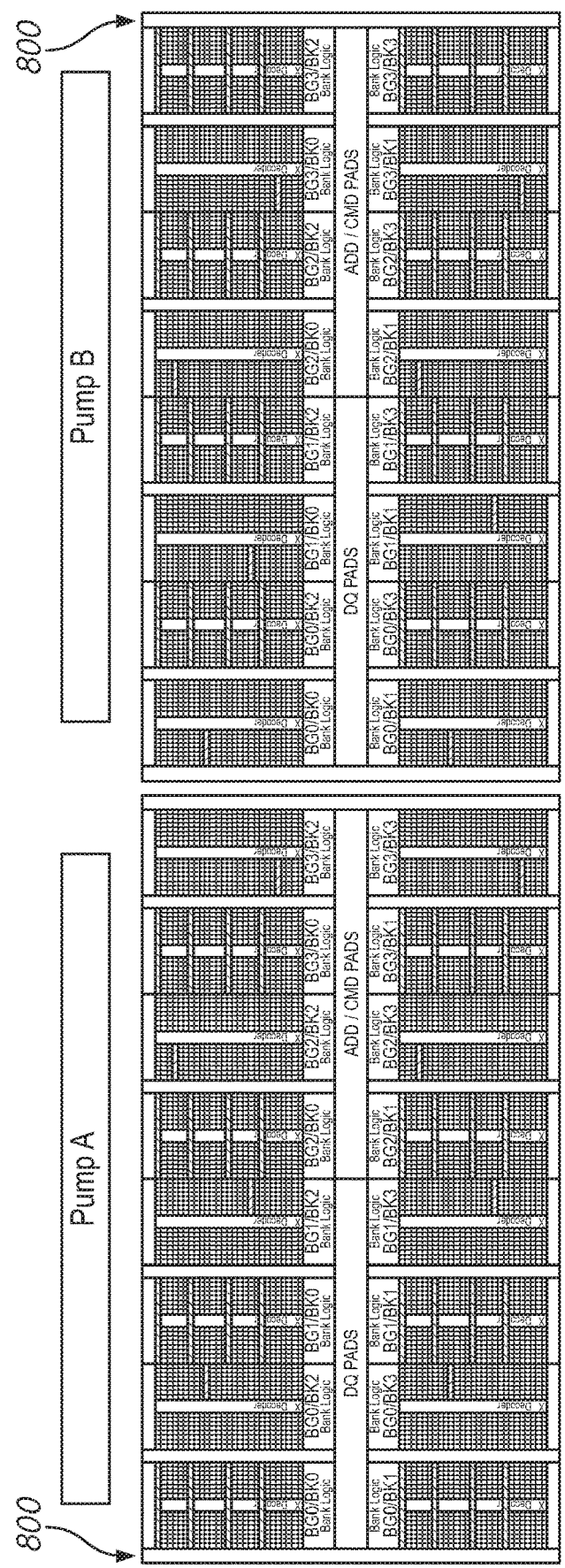
FIG. 8A illustrates an example of two different refresh operations in a memory device according to an embodiment of the disclosure.

FIG. 8A illustrates an example of two different refresh operations in a memory device according to an embodiment of the disclosure. The memory device 800 includes a memory array divided into sixteen memory banks BK0-15. In some embodiments, the memory device 800 may be included in semiconductor device 200, semiconductor device 300, and/or semiconductor device 400. Responsive to a pump of a refresh operation Pump A, eight rows (e.g., word lines), indicated by the thick lines in FIG. 8A, are refreshed in half of the banks and one row is refreshed in the other half of the banks. In some examples, the refresh operation where eight rows are refreshed may be an auto refresh operation and the refresh operation where one row is refreshed may be a targeted refresh operation. Responsive to another pump of the refresh operation Pump B, one row is refreshed in the half of the banks that had previously refreshed eight rows and eight rows are refreshed in the half of the banks that had previously refreshed one row. As illustrated, responsive to Pump A, 72 rows in memory device 800 are refreshed and 72 rows are refreshed responsive to Pump B.

Figure 8B:
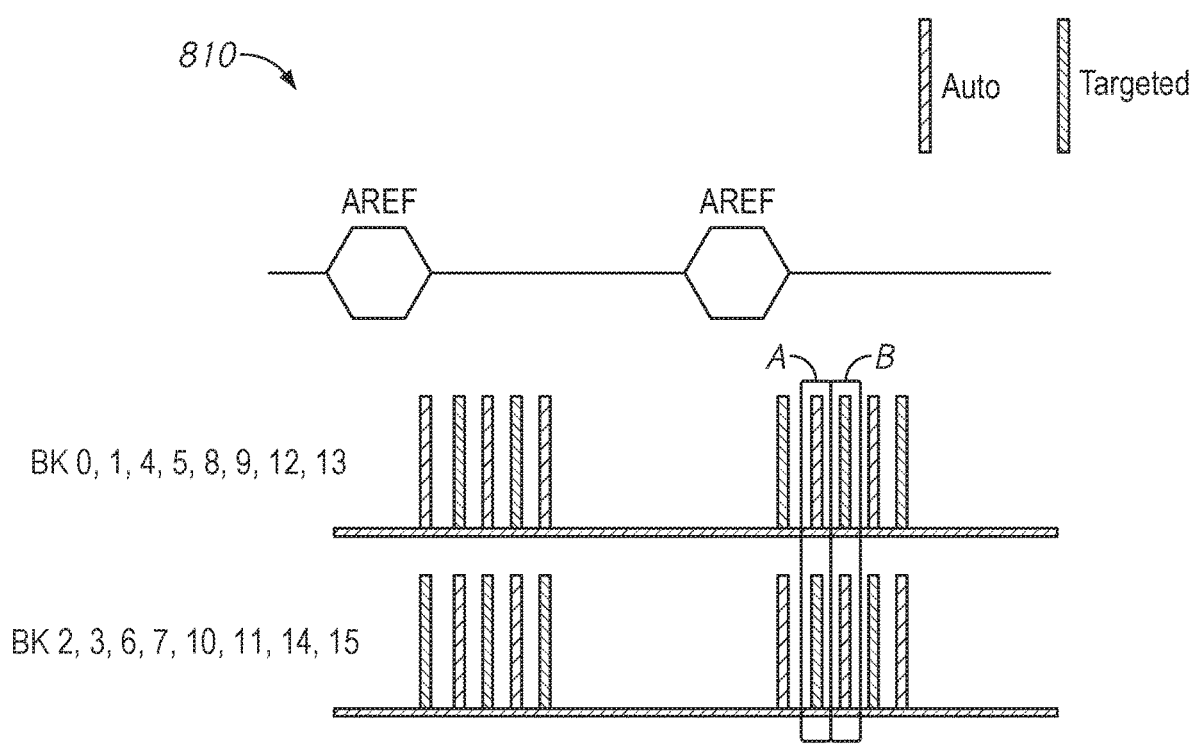
FIG. 8B is an example timing diagram of refresh operations in the memory device of FIG. 8A.

FIG. 8B is an example timing diagram of refresh operations in the memory device of FIG. 8A. In timing diagram 810, the top row illustrates when refresh commands AREF are received. The second and third lines of timing diagram 810 illustrate refresh activation signals (e.g., pumps) provided to two groups of banks of memory device 800, illustrated as vertical lines. In the example shown in FIG. 8B, the pumps are associated with one of two types of refresh operations: auto refresh and targeted refresh. Different refresh states of Pump A and Pump B shown in FIG. 8A correspond to the phase of boxes A and B in FIG. 8B, respectively. As shown in both FIGS. 8A and 8B, one type of refresh operation is performed on some of the banks during a pump and another type of refresh operation is performed on other banks rather than a same type of refresh operation being performed on all of the banks as shown in FIGS. 1A and 1B.

In comparison to FIGS. 1A and 1B, by performing different refresh operations in different banks with different pumps of the refresh operation as illustrated in FIGS. 8A and 8B, a peak number of rows refreshed at one time has been reduced from 128 to 72. In some applications, this may reduce the peak current draw. In some applications, this may reduce the risk of errors in future memory operations.

Although examples provided herein describe two different types of refresh operations (e.g., auto refresh and targeted refresh operations), in some embodiments, additional types of refresh operations may be performed by a memory device (e.g., refresh management refresh operations). In these embodiments, more than two refresh type signals may be provided to the bank region. In some embodiments where more than two types of refresh operations are performed, the refresh type state control circuit may include a multi-bit counter (e.g., two-bit counter), which may be used to generate the refresh type signals for different bank regions. A count of the counter circuit may change with one or more pumps of a multi pump refresh operation. States of the refresh type signals may change when count changes.

The present disclosure is drawn to apparatuses, systems, and methods for performing multiple types of refresh operations responsive to a pump of the refresh signal. Different portions of a memory may perform different types of refresh operations responsive to a pump. For example, one type of refresh operation (e.g., auto refresh) may be performed on one or more rows and another type of refresh operation (e.g., targeted refresh) may be performed on one or more other rows responsive to the pump. In some embodiments, one type of refresh operation may be performed on some memory banks while another type of refresh operation may be performed on other memory banks responsive to a pump. Responsive to a subsequent pump, different types of refresh operations may be performed on the memory banks. In some embodiments, what type of refresh operations is performed on the memory banks responsive to the pumps may alternate. By performing different types of refresh operations responsive to a pump, a peak number of rows refreshed responsive to a pump may be reduced. This may in turn reduce a peak current draw by the memory device. In some embodiments, the apparatuses, systems, and methods may be implemented by a circuit with relatively few components that may be shared by multiple banks.

Of course, it is to be appreciated that any one of the examples, embodiments or processes described herein may be combined with one or more other examples, embodiments and/or processes or be separated and/or performed amongst separate devices or device portions in accordance with the present systems, devices and methods.

Finally, the above-discussion is intended to be merely illustrative of the present system and should not be construed as limiting the appended claims to any particular embodiment or group of embodiments. Thus, while the present system has been described in particular detail with reference to exemplary embodiments, it should also be appreciated that numerous modifications and alternative embodiments may be devised by those having ordinary skill in the art without departing from the broader and intended spirit and scope of the present system as set forth in the claims that follow. Accordingly, the specification and drawings are to be regarded in an illustrative manner and are not intended to limit the scope of the appended claims.

What is claimed is:

1. An apparatus comprising:
a plurality of memory banks; and
a plurality of refresh control circuits, individual ones of the plurality of refresh control circuits associated with corresponding individual ones of the plurality of memory banks, wherein individual ones of the plurality of refresh control circuits are configured to cause one of a plurality of refresh operation types to be performed on the corresponding individual ones of the plurality of memory banks responsive, at least in part, to a refresh type signal, wherein a refresh operation type of the plurality of refresh operations types is based, at least in part, on a state of the refresh type signal; and
a refresh type state control circuit configured to provide the refresh type signal to the plurality of refresh control circuits, wherein the refresh type signal comprises a plurality of refresh type signals, wherein a first refresh type signal of the plurality of refresh type signals is provided to a first group of the plurality of first refresh control circuits and a second refresh type signal of the plurality of refresh type signals is provided to a second group of the plurality of first refresh control circuits, wherein a state of the first refresh type signal is different from a state of the second refresh type signal, the refresh type state control circuit comprising:
a flip-flop circuit, wherein an output of the flip-flop circuit provides the first refresh type signal;
an inverter configured to receive the output of the flip-flop as an input and an output of the inverter provides the second refresh type signal;
a second inverter configured to receive a pump signal as an input and provide an inverted pump signal as an output to a clock input of the flip-flop;
a first latch configured to latch the output of the inverter responsive to a falling edge of the pump signal; and a second latch configured to latch the output of the flip-flop responsive to the falling edge of the pump signal.

2. The apparatus of claim 1, further comprising a refresh pump generator configured to provide at least one pump responsive, at least in part, to an active refresh signal, wherein the refresh type state control circuit is configured to change at least one of the state of the first refresh type signal or the state of the second refresh type signal responsive to the at least one pump.

3. The apparatus of claim 1, wherein each refresh type signal of the plurality of refresh type signals has a different state.

4. The apparatus of claim 1, wherein the refresh type state control circuit comprises a counter, comprising the flip-flop and the inverter, configured to generate the plurality of refresh type signals.

5. The apparatus of claim 4, wherein the counter is a one-bit counter.

6. The apparatus of claim 1, wherein the output of the inverter is further provided as a data input to the flip-flop.

7. An apparatus comprising:
a refresh control circuit comprising a first portion and a second portion including a plurality of portions,
wherein the first portion includes;
a counter circuit configured to provide, based at least in part, on a count value, a first refresh type signal to at least one of the plurality of portions of the second portion and a second refresh type signal to at least another one of the plurality of portions of the second portion, wherein a state of the first refresh type signal and a state of the second refresh type signal indicate a refresh operation type of a plurality of refresh operation types to be performed during a refresh operation;
an inverter configured to receive a pump signal as an input and provide an output to the counter circuit;
a first latch configured to latch the first refresh type signal responsive to a falling edge of the pump signal; and
a second latch configured to latch the second refresh type signal responsive to the falling edge of the pump signal, and
wherein the second portion is configured to cause the refresh operation to be performed on a plurality of memory banks, wherein the refresh operation performed on individual ones of the plurality of memory banks is of the refresh operation type indicated by the first refresh type signal or the second refresh type signal.

8. The apparatus of claim 7, wherein the first portion further includes a refresh pump generator configured to provide a plurality of pumps responsive to a refresh signal, wherein the counter circuit is configured to change the count value responsive to each pump of the plurality of pumps.

9. The apparatus of claim 8, wherein the counter circuit is configured to change the count value responsive to a falling edge of each pump of the plurality of pumps.

10. The apparatus of claim 7, wherein the first portion is included in a peripheral region of a memory device and individual ones of the plurality of portions of the second portion are included in a respective bank region of a plurality of bank regions of the memory device, the plurality of bank regions separate from the peripheral region, wherein individual ones of the plurality of memory banks are included in corresponding ones of the plurality of bank regions.

11. The apparatus of claim 10, further comprising a command decoder circuit included in the peripheral region, wherein the refresh operation is performed responsive, at least in part, to an active refresh signal provided by the command decoder.

12. The apparatus of claim 7, wherein the state of the first refresh type signal is complementary to the state of the second refresh type signal.

13. The apparatus of claim 7, wherein the counter circuit comprises a flip-flop configured to receive the output of the inverter and provide the first refresh type signal.

14. The apparatus of claim 13, wherein the counter circuit further comprises an inverter configured to receive the first refresh type signal and output the second refresh type signal.

* * * * *